United States Patent

Tanaka et al.

[11] Patent Number: 5,847,992
[45] Date of Patent: Dec. 8, 1998

[54] MULTI-LEVEL NON-VOLATILE SEMICONDUCTOR MEMORY DEVICE HAVING IMPROVED MULTI-LEVEL DATA STORING CIRCUITS

[75] Inventors: Tomoharu Tanaka; Junichi Miyamoto, both of Yokohama; Koji Sakui, Tokyo, all of Japan

[73] Assignee: Kabushiki Kaisha Toshiba, Kawasaki, Japan

[21] Appl. No.: 883,370

[22] Filed: Jun. 26, 1997

[30] Foreign Application Priority Data

Nov. 1, 1996 [JP] Japan .................................. 8-291671

[51] Int. Cl.$^6$ ............................. G11C 16/04; G11C 16/06
[52] U.S. Cl. ............................... 365/185.03; 365/185.17; 365/185.21
[58] Field of Search .................... 365/185.03, 185.17, 365/185.21, 185.22

[56] References Cited

U.S. PATENT DOCUMENTS 5,521,865  5/1996  Ohuchi et al. ..................... 365/185.22
5,570,315  10/1996  Tanaka et al. ..................... 365/185.22
5,602,789  2/1997  Endoh et al. ...................... 365/185.03

*Primary Examiner*—Son Mai
*Attorney, Agent, or Firm*—Foley & Lardner

[57] ABSTRACT

A multi-value storing EEPROM having data-storing circuits, each storing a control data item which determines a write-control voltage to be applied to one bit line in order to write data into any memory cell connected to the bit line. The write-control voltage is applied to the bit line to write data into the memory cell, on the basis of the control data item stored in the data-storing circuit. To read the data from the cells, a bit-line signal is supplied to the bit line in accordance with the control data item stored in the data-storing circuit. To achieve write verification, the value of the bit-line signal on the bit line is detected from the data-storing state the memory cell assumes. The control data item stored in the circuit can be changed on the basis of the data-storing state of the memory cell.

28 Claims, 19 Drawing Sheets

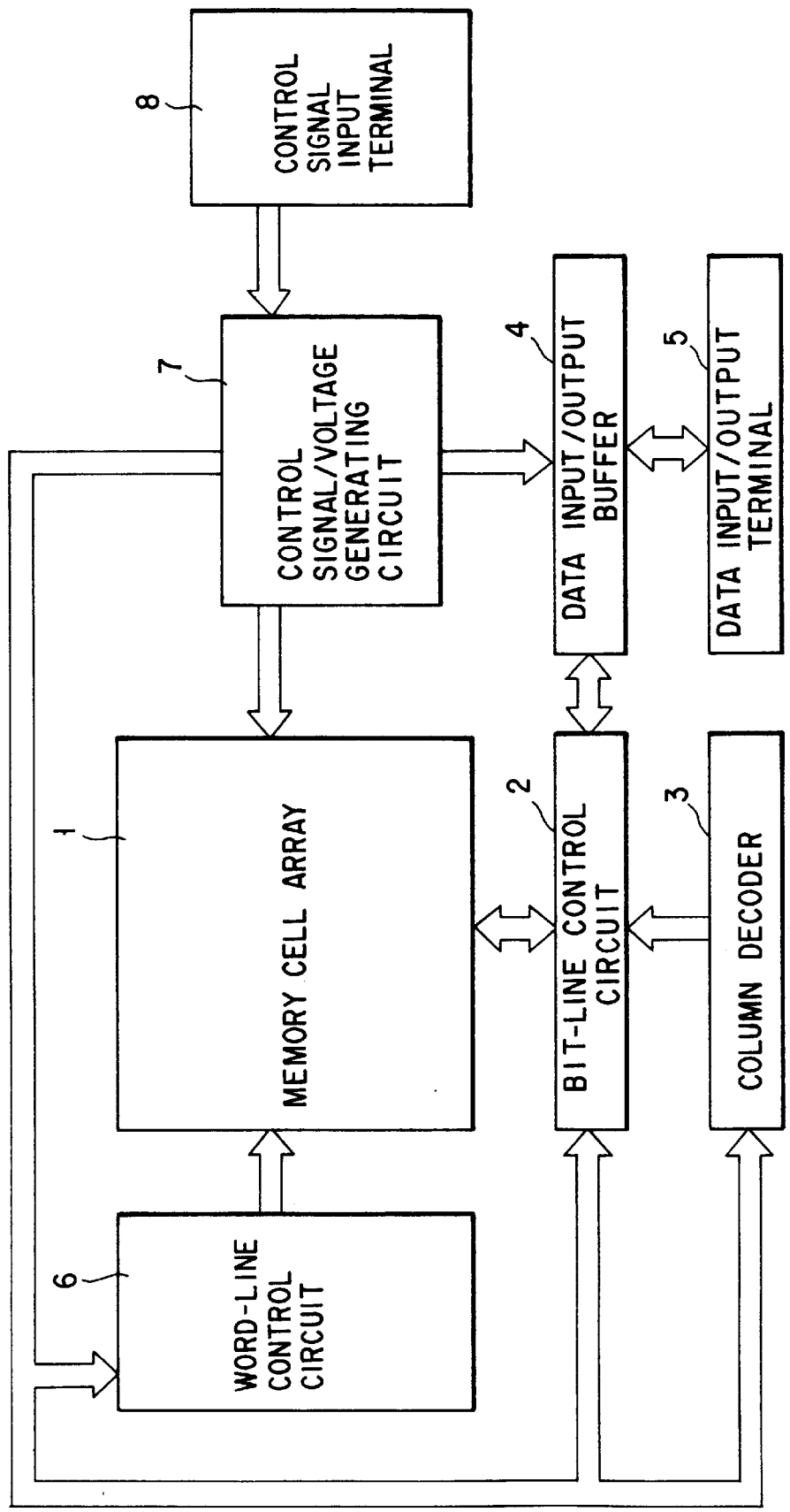
F I G. 1

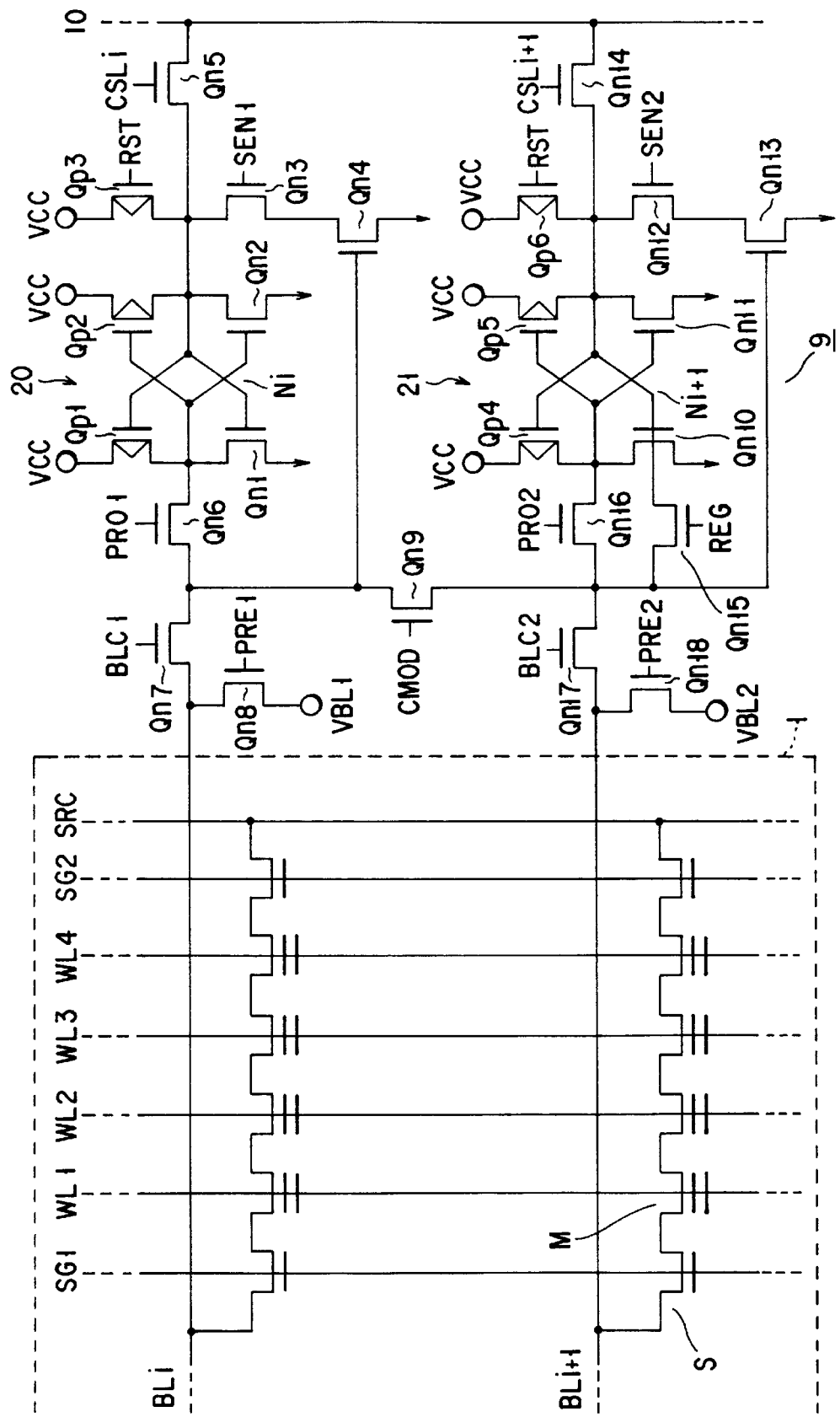
F I G. 5

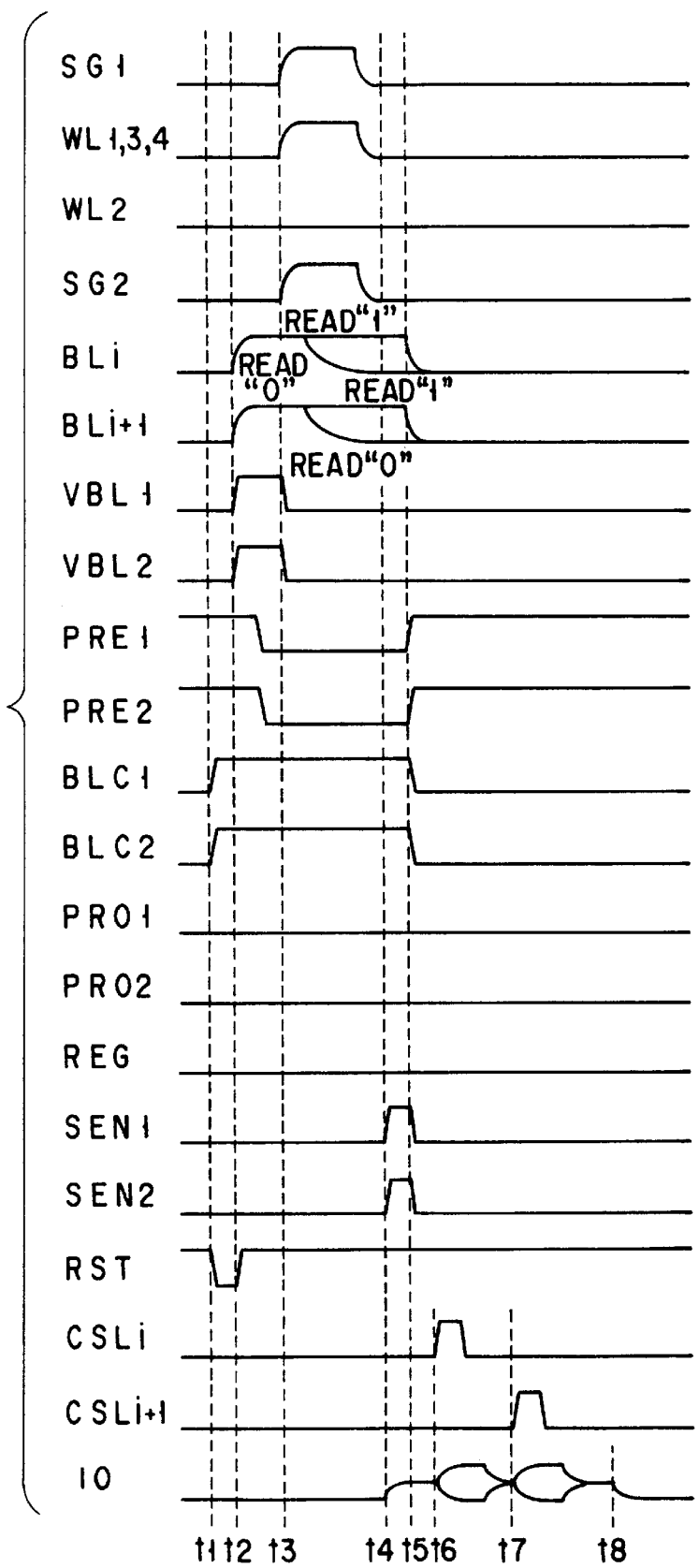
F I G. 10

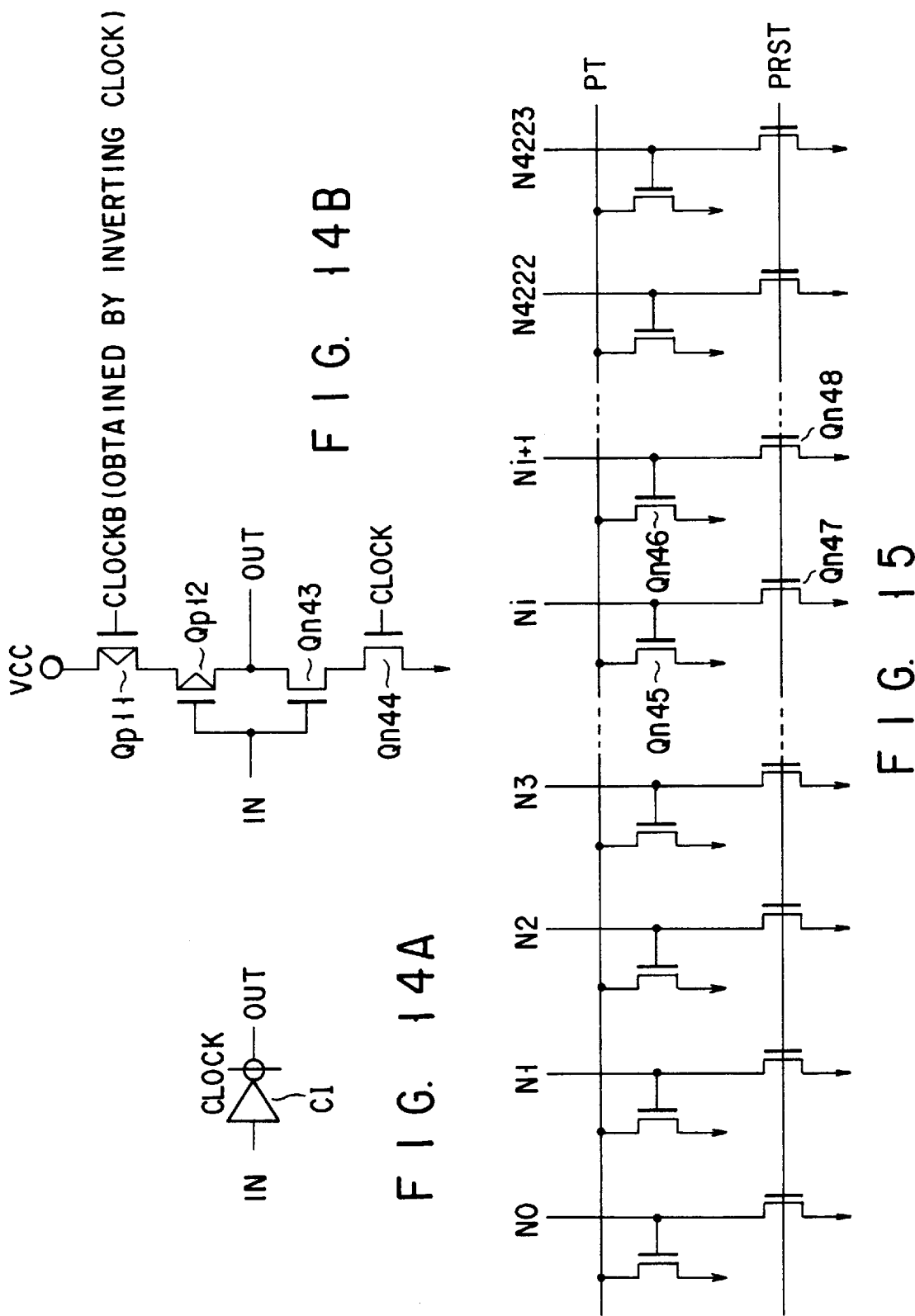

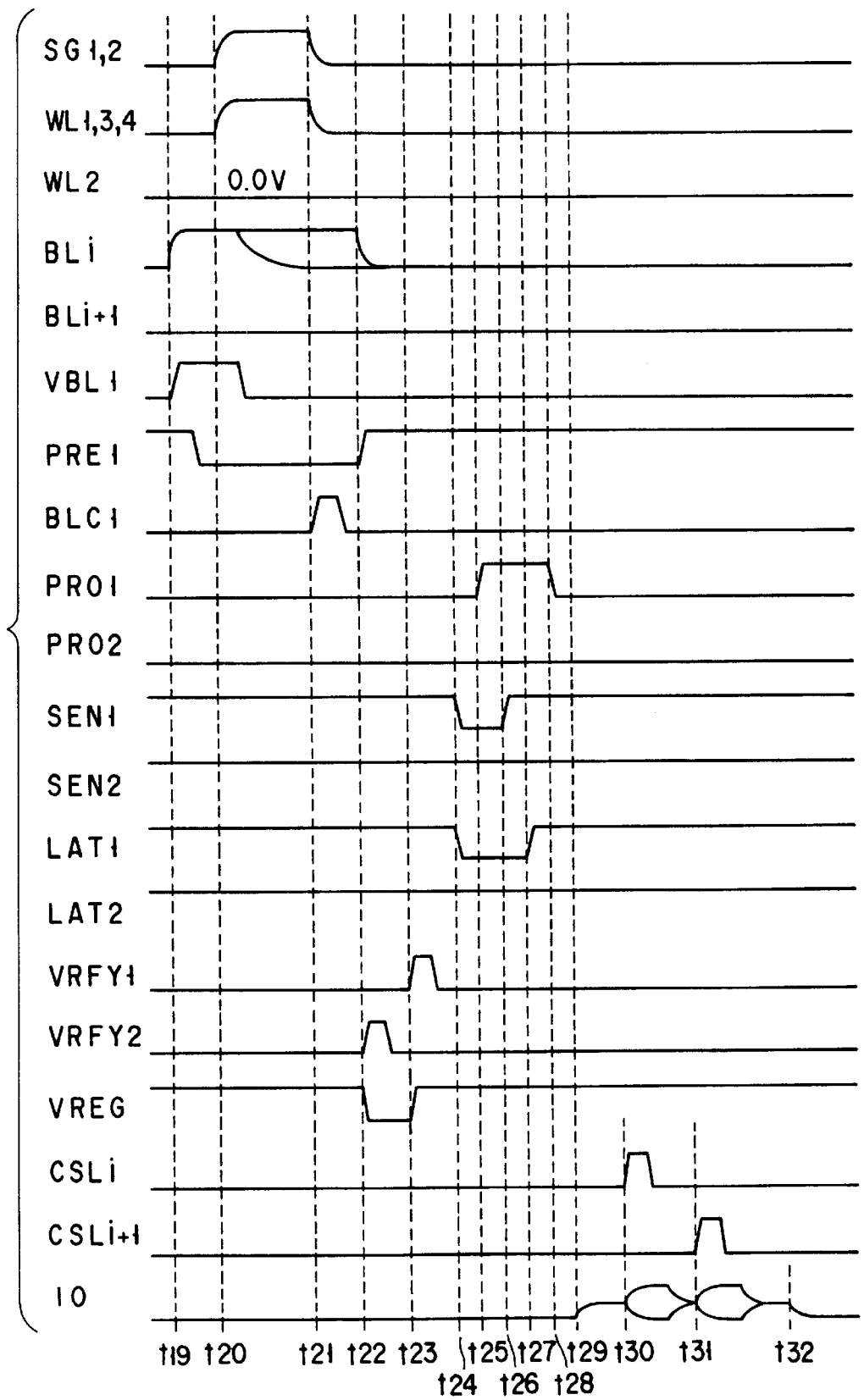
F I G. 17

MULTI-LEVEL NON-VOLATILE SEMICONDUCTOR MEMORY DEVICE HAVING IMPROVED MULTI-LEVEL DATA STORING CIRCUITS

BACKGROUND OF THE INVENTION

The invention relates to an electrically erasable programmable read-only memory (EEPROM), and more particularly to an EEPROM in which a data item represented by two or more bits is stored in each memory cell.

A memory cell for use in an EEPROM is known which has MOSFET structure comprising charge-storage layers (floating gates) and control gates which are provided one upon another. Generally, one memory cell stores one-bit data, "0" or "1", in accordance with the charge stored in the floating gate of the cell. There is known a multi-value storing method for storing a multi-bit data item in one memory cell. The multi-value storing method serves to provide an EEPROM which can store data in higher density. In a four-value storing method, for example, to store a data item, "0", "1", "2" or "3" in one memory cell, one of four charges corresponding to these four values is stored in the floating gate of the memory cell.

How one of the four values is stored in one memory cell in the four-value storing method will be explained in detail. To store the value "0", the floating gate of the memory cell is rendered electrically neutral and then electrically positive, whereby data is erased in the memory cell. When assuming the data-erased state, the memory cell stores data "0". The data in the cell is erased in the cell by applying a high voltage (approximately 20V) to the substrate of the EEPROM and by setting the control gate of the memory cell at 0V.

To store the value "1" in the memory cell, a negative charge is accumulated in the floating gate of the memory cell. To store the value "2", a greater negative charge is accumulated in the floating gate. To store the value "3", a still greater negative charge is accumulated in the floating gate. These values can be stored in the memory cell by applying 0V to the substrate of the EEPROM and the source and drain of the memory cell at 0V and a high voltage (approximately 20V) to the control gate of the cell.

Thus, one memory cell can store four different values "0" to "3".

A multi-value storing EEPROM is known, in which two or more bytes of data are written at a time into the memory cells, in the form of multi-level data items. The bytes of data are written at a time, in order to shorten the time required for writing these bytes. An EEPROM of this type is disclosed in, for example, Jpn. Pat. Appln. KOKAI Publication No. 7-93979 which corresponds to a Japanese patent application filed by the assignee of the present application. The multi-value storing EEPROM disclosed in this publication has a plurality of data-storing circuits for storing control data for use in writing the multi-value data items into the memory cells, respectively. To determine whether or not a data item has been accurately written into each memory cell, the state of the memory cell is detected. If any memory cell has not yet fully stored the data item, the control data stored in the data-storing circuits is altered. The data items are then written again into the memory cells in accordance with the control data thus altered. The states of the memory cells are repeatedly detected and the data items are repeatedly written into the memory cells until all selected memory cells store complete data items.

In order to detect the state of each memory cell, a read signal is supplied to the drain of the memory cell and a signal, if any, is provided on the basis of the data item stored in the memory cell. More precisely, it is detected whether the memory cell has fully stored the data item which is "1", "2" or "3"

An EEPROM of the type wherein a multi-value data item is written into each memory cell by repeatedly altering control data must have complex data-storing circuits for storing the control data and a complicated circuit for controlling these data-storing circuits. Further, each data-storing circuit which must store a multi-level control data item becomes redundant in the case where the multi-data EEPROM is used as a two-value EEPROM.

As mentioned above, the multi-value storing method is an effective means for storing data in higher density. However, it requires a complicated circuit for controlling components other than the memory cells. Moreover, the data-storing circuits become redundant when the multi-data EEPROM is used as a two-value EEPROM.

BRIEF SUMMARY OF THE INVENTION

Accordingly, an object of the present invention is to provide a multi-value storing EEPROM which has a simple circuit for controlling components other than the memory cells.

Another object of the invention is to provide a multi-value storing EEPROM in which the data-storing circuits can be efficiently used even when the EEPROM is utilized as a two-value storing EEPROM.

To achieve these objects, nonvolatile semi-conductor memory devices according to the invention may include structures as described herein.

According to a first aspect of the invention, there is provided a nonvolatile semiconductor memory device which comprises a memory cell array including a plurality of nonvolatile memory cells, each capable of storing an n-value data item where n≧3, a plurality of bit lines, a plurality of word lines, and a plurality of data-storing circuits, each connected to one bit line, for storing a control data item which determines a write-control voltage to be applied to the bit line for writing data items into the memory cells connected to the bit line. The memory device is characterized in that each data-storing circuit supplies the write-control voltage and a read bit-line signal to the bit line in accordance with the control data item, detects a signal level of the read bit-line signal converted in response to the data-storing state of the memory cell, and changes the control data item on the basis of the data-storing state of the memory cell.

Preferred embodiments of the memory device according to the first aspect of the present invention are as follows:

(1) Each of the data-storing circuits comprises two sub-data circuits, each for storing sub-data item of a first signal level or a second signal level. Each of the sub-data circuits changes the sub-data item of the first signal level, which is stored, to sub-data item of the second signal level, in response to a prescribed signal level of the read bit-line signal, and holds the sub-data item of the second signal level.

(2) Each of the memory cells can store a four-value data item, and each of the data-storing circuits includes two sub-data circuits.

(3) Each of the memory cells can store a three-value data item, and each of the data-storing circuits includes two sub-data circuits.

According to a second aspect of the invention, there is provided a nonvolatile semiconductor memory device which comprises a memory cell array including a plurality of nonvolatile memory cells, each assuming one of data-writing states corresponding to n data-storing levels where $n \geq 3$, a plurality of bit lines, a plurality of word lines, and a plurality of data-storing circuits, each connected to one bit line for storing one of n control data items of n logic levels for determining a write-control voltage to be applied to a bit line, thereby to write data items into the memory cells connected to the bit line. The memory device is characterized in some respects. First, each data-storing circuit supplies the write-control voltage to the bit line in accordance with a control data item. Second, each data-storing circuit supplies a read bit-line signal to the bit line when the control data item is at the i-th logic level or the first logic level, thereby to detect whether the data-writing state of the memory cell connected to the data-storing circuit which stores a control data item at the i-th logic level (i=2 to n) is identified by the i-th data-storing level which corresponds to the i-th logic level. Third, each data-storing circuit detects a signal level of the read bit-line signal converted in response to the data-storing state of the memory cell, and changes the control data item on the basis of the data-storing state of the memory cell.

The following are preferred embodiments of the memory device according to the second aspect of the present invention.

(1) Each of the data-storing circuits comprises sub-data circuits, each for storing sub-data item of a first signal level or a second signal level. Each of the sub-data circuits changes the sub-data item of the first signal level, which is stored, to sub-data item of the second signal level in response to a prescribed signal level of the read bit-line signal, and holds the sub-data item of the second signal level.

(2) Each of the memory cells can store a four-value data item, and each of the data-storing circuits includes two sub-data circuits.

(3) Each of the memory cells can store a three-value data item, and each of the data-storing circuits includes two sub-data circuits.

According to a third aspect of the invention, there is provided a nonvolatile semiconductor memory device which comprises a memory cell array including a plurality of nonvolatile memory cells, a plurality of bit lines, a plurality of word lines, switching means capable of assuming a first state to set four data-writing states for each memory cell and a second state to set two data-writing states for each memory cell, and a plurality of sub-data circuits, each for storing a sub-data item. The memory device is characterized in two respects. First, while the switching means remains in the first state, each pair of the sub-data circuits operates as a single data-storing circuit, and the data-storing circuit is electrically connected one bit line and stores a control data item defined by two sub-data items. The control data item determines a write-control voltage which is to be applied to the bit line in order to set one of the four data-writing states into the memory cells connected to the bit line. Second, while the switching means remains in the second state, each sub-data circuit operates as a single data-storing circuits, and each data-storing circuit is electrically connected one bit line and stores a control data item defined by one sub-data item. The control data item determines a write-control voltage which is to be applied to the bit line in order to set one of the two data-writing states into the memory cells connected to the bit line.

The following is a preferred embodiment of the memory device according to the third aspect of the invention.

Each of the sub-data circuits stores a sub-data item of a first signal level or a second signal level and changes the sub-data item of the first signal level, which is stored, to a sub-data item of the second signal level, in response to a prescribed level of a bit-line signal, and holds the sub-data item of the second signal level.

According to a fourth aspect of the invention, there is provided a nonvolatile semiconductor memory device which comprises a memory cell array including a plurality of nonvolatile memory cells, a plurality of bit lines, a plurality of word lines, switching means capable of assuming a first state to set three data-writing states for each memory cell and a second state to set two data-writing states for each memory cell, and a plurality of sub-data circuits, each for a storing sub-data item. The memory device is characterized in that while the switching means remains in the first state, each pair of the sub-data circuits operates as a single data-storing circuit, and each data-storing circuit is electrically connected to one bit line and stores a control data item defined by two sub-data items. The control data item determines a write-control voltage which is to be applied to the bit line in order to set one of the three data-writing states into the memory cells connected to the bit line. The device is characterized also in that while the switching means remains in the second state, each of the sub-data circuits operates as a single data-storing circuit, and each data-storing circuit is electrically connected to one bit line and stores a control data item defined by one sub-data item. The control data item determines a write-control voltage which is to be applied to the bit line in order to set one of two data-writing states into the memory cells connected to the bit line.

The following is a preferred embodiment of the memory device according to the fourth aspect of the invention.

Each of the sub-data circuits stores a sub-data item of a first signal level or a second signal level and changes the sub-data item of the first signal level, which is stored, to a sub-data item of the second signal level, in response to a prescribed level of a bit-line signal, and holds the sub-data item of the second signal level.

According to a fifth aspect of the invention, there is provided a nonvolatile semiconductor memory device which comprises a memory cell array including a plurality of nonvolatile memory cells, each capable of storing n-value data item where $n \geq 3$, a plurality of bit lines, a plurality of word lines, and a plurality of data-storing circuits, each connected to one bit line. The memory device is characterized in that each data-storing circuit stores a data item and supplies a read bit-line signal to the bit line in accordance with the data item, detects a signal level of the read bit-line signal converted in response to the data item stored in the memory cell connected to the bit line, and stores the signal level of the read bit-line signal, thus detected.

The following are preferred embodiments of the memory device according to the fifth aspect of the present invention.

(1) Each of the data-storing circuits comprises sub-data circuits, each for storing sub-data item of a first signal level or a second signal level. Each of the sub-data circuits changes the sub-data item of the first signal level, which is stored, to sub-data item of the second signal level, in response to a prescribed signal level of the read bit-line signal, and holds the sub-data item of the second signal level.

(2) Each of the memory cells can store four-value data item, and each of the data-storing circuits includes two sub-data circuits.

(3) Each of the memory cells can store three-value data item, and each of the data-storing circuits includes two sub-data circuits.

The nonvolatile semiconductor memory devices described above, which are generally the first embodiment of the present invention, can store n-value data where $n \geq 3$. In this EEPROM a read signal is supplied to selected memory cells in accordance with the control data item stored in each data-storing circuit. The control data item stored in one data-storing circuit can therefore be changed easily, and the structure of the EEPROM can be more simple than otherwise. Since a read signal is supplied to selected memory cells, data can be easily read from the selected memory cells. This also helps to simplify the structure of the EEPROM, making it possible to provide an inexpensive EEPROM.

Each of the data-storing circuits for storing control data items may be used to write four-value data items into the memory cells. Each data-storing circuit may be divided into two units. Then, each unit can store control data items used to write two-value data items into the memory cell. If so, the data-storing circuits incorporated in the EEPROM do not become redundant. Thus, the EEPROM is less expensive than otherwise.

Alternatively, each data-storing circuit may be used to write three-value data items into the memory cells, and may be divided into two units. Thus, each unit can store control data items used to write two-value data items into the memory cell. In this case, too, the data-storing circuits incorporated in the EEPROM do not become redundant, and the EEPROM is less expensive than otherwise.

A nonvolatile semiconductor memory device according to the sixth aspect of the present invention comprises a memory cell array including a plurality of nonvolatile memory cells, a plurality of data transfer lines connected to the memory cell array, for transferring read signals indicating the data-storing states of the memory cells, and a plurality of data-storing circuits for storing control data items determining write-control voltages to be applied to the memory cells to write data items into the memory cells. The memory device is characterized in some respects. First, each data-storing circuit comprises a first sub-data circuit and a second sub-data circuit. Second, the control data item stored in each data-storing circuit is composed of a first sub-data item stored in the first sub-data circuit and a second sub-data item stored in the second sub-data circuit. Third, each data-storing circuit applies the write-control voltage to corresponding memory cell, in accordance with the control data item. Fourth, the second sub-data circuit detects a logic level of the read signal on the data transfer line, the logic level being determined by the data-storing state of the corresponding memory cell and the first sub-data item stored in the first sub-data circuit. Further, the second sub-data circuit changes the second sub-data item to suppress the writing of the data item into the memory cell when it is determined that the data item has been completely written in the memory cell.

The following are preferred embodiments of the memory device according to the sixth aspect of the present invention.

(1) The second sub-data circuit selectively detects, in accordance with the second sub-data item, the logic level of the read signal on the data transfer line which is determined by the data-storing state of the corresponding memory cell and the first sub-data item stored in the first sub-data circuit.

(2) The first sub-data circuit detects the logic level of the read signal on the data transfer line, which is determined by the data-storing state of the corresponding memory cell and the second sub-data item stored in the second sub-data circuit, and changes the first sub-data item to suppress the writing of the data item into the memory cell when it is determined that the data item has been completely written in the memory cell.

(3) The first sub-data circuit selectively detects, in accordance with the first sub-data item, the logic level of the read signal on the data transfer line which is determined by the data-storing state of the corresponding memory cell and the second sub-data item stored in the second sub-data circuit.

(4) The first sub-data circuit selectively detects, in accordance with the first sub-data item, the logic level of the read signal on the data transfer line, which is determined by the data-storing state of the corresponding memory cell and the second sub-data item stored in the second sub-data circuit, and changes the first sub-data item to suppress the writing of the data item into the memory cell when it is determined that the data item has been completely written in the memory cell.

(5) Each of the memory cells can store a four-value data item, and the first sub-data circuit and the second sub-data circuit each comprise one flip-flop circuit composed of two inverters.

(6) Each of the memory cells can store a three-value data item, and the first sub-data circuit and the second sub-data circuit each comprise one flip-flop circuit composed of two inverters.

A nonvolatile semiconductor memory device (EEPROM) according the seventh aspect of the present invention comprises a memory cell array including a plurality of nonvolatile memory cells, a plurality of data transfer lines connected to the memory cell array, for transferring read signals representing the data items stored in the memory cells, and a plurality of data-storing circuits for storing data items to be read, which represent the data item stored in the memory cells. The memory device is characterized in some respects. First, each data-storing circuit comprises a first sub-data circuit and a second sub-data circuit. Second, each data item to be read is composed of a first sub-data item stored in the first sub-data circuit and a second sub-data item stored in the second sub-data circuit. Third, the first sub-data circuit detects and stores the logic level of the read signal on the data transfer line, the logic level being determined by the data item stored in the corresponding memory cell and the second sub-data item stored in the second sub-data circuit.

The following are preferred embodiments of the memory device according to the seventh aspect of the present invention.

(1) The first sub-data circuit selectively detects, in accordance with the first sub-data item, the logic level of the read signal on the data transfer line, which is determined by the data item stored in the corresponding memory cell and the second sub-data item stored in the second sub-data circuit.

(2) Each of the memory cells can store a four-value data item, and the first sub-data circuit and the second sub-data circuit each comprise one flip-flop circuit composed of two inverters.

(3) Each of the memory cells can store a three-value data item, and the first sub-data circuit and the second sub-data circuit each comprise one flip-flop circuit composed of two inverters.

In each of the data-storing circuits, the second sub-data circuit detects the logic level of the read signal on the data transfer line, the logic level being determined by the data-storing state of any selected memory cell and the first sub-data item stored in the first sub-data circuit. In some case, the first sub-data circuit detects the logic level of the read signal on the data transfer line, the logic level being determined by the data-storing state of the selected memory cell and the second sub-data item stored in the second sub-data circuit. The control data stored in the data-storing circuit can therefore be easily changed. This helps to simplify the circuit structure of the memory device. Furthermore, the first sub-data circuit detects the logic level of the read signal on the data transfer line, the logic level being determined by the data item stored in the selected memory cell and the second sub-data item stored in the second sub-data circuit. Hence, the data item can therefore be easily read from the memory cell, and the memory device can be simple in structure. Hence, an inexpensive EEPROM can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of a nonvolatile semiconductor memory device according to a first embodiment of the present invention;

FIG. 5 is a circuit diagram depicting in detail a part of the memory cell array shown in FIG. 1 and one of the data-storing circuits shown in FIG. 1;

FIG. 10 is a timing chart for explaining how two-value data is read from the memory cells of the memory device according to the first embodiment of the invention;

FIG. 14A is a symbol diagram of one of the identical clocked inverters used in the data-storing circuits shown in FIG. 13;

FIG. 14B is a circuit diagram of the clocked inverter represented by FIG. 14A;

FIG. 15 is a circuit diagram of the circuit peripheral to the data-storing circuit shown in FIG. 13;

FIG. 17 is a timing chart for explaining a second method of reading four-value data from the memory cells of the device according to the second embodiment of the invention;

DETAILED DESCRIPTION OF THE INVENTION

Figure 2:
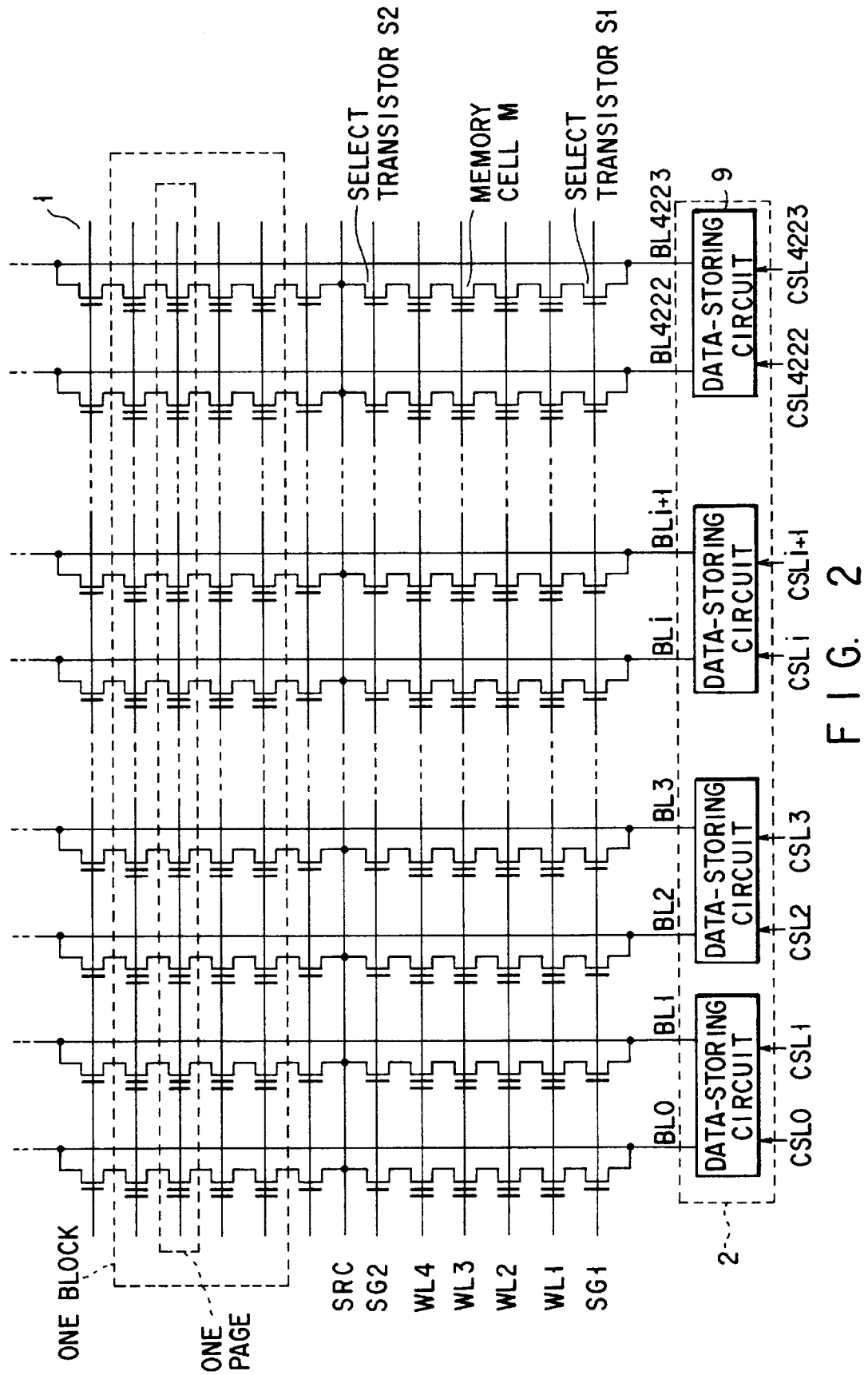
FIG. 2 is a circuit diagram showing the memory cell array and bit-line control circuit which are incorporated in the memory device shown in FIG. 1.

Embodiments of the present invention will be described, with reference to the accompanying views of the drawing.

FIG. 1 is a schematic representation of a non-volatile semiconductor memory (EEPROM) which is the first embodiment of the present invention.

The EEPROM has a memory cell array 1 which comprises a plurality of memory cells arranged to form a matrix. Data can be rewritten in each of the memory cells. A plurality of bit lines and a plurality of word lines extend above the memory cell array 1. Memory cells forming a row are connected to one bit line, and the memory cells forming a column are connected to one word line. The EEPROM comprises a bit-line control circuit 2 and a word-line control circuit 6.

The bit-line control circuit 2 reads data from the memory cells of the array 1 through the bit lines, detects the states of the memory cells through the bit lines and applies a write-control voltage to the memory cells through the bit lines. The circuit 2 has a plurality of data-storing circuits, which store the data items read from the memory cells. The data item stored in any data-storing circuit that is selected by a column decoder 3 is output to an external device through a data input/output buffer 4 and a data input/output terminal 5. The data to be written into the memory cell array 1, input from an external device to the input/output terminal 5, is supplied, as initial control data, through the data input/output buffer 4 to any data-storing circuit selected by the column decoder 3.

The word-line control circuit 6 applies a voltage to at least one of the word lines, thereby to select the word line so that data may be read from, written into or erased in the memory cells connected to the word line.

The EEPROM further comprises a control signal/ voltage generating circuit 7 and a control signal input terminal 8. The section 7 generates control signals and control voltages, which control the memory cell array 1, bit-line control circuit 2, column decoder 3, data input/output buffer 4 and word-line control circuit 6. The section 7 is controlled by a control signal supplied to the control signal input terminal 8 from an external device.

FIG. 2 shows the memory cell array 1 and the bit-line control circuit 2, both incorporated in the EEPROM illustrated in FIG. 1.

Four memory cells M are connected in series, constituting a NAND-type cell unit. The cell unit is connected at one end to a bit line BL by a select transistor S1, and at the other end to a common source line SRC by the current path of a select transistor S2. The control gate electrode of each memory cell M is connected to a word line WL. The select transistors S1 and S2 are connected to select gates SG1 and SG2, respectively. The memory cells connected to one word line WL constitute a unit called "page." Four pages constitute one block. Only two blocks are illustrated in FIG. 2. The memory cell array 1 is composed of, for example, 1,024 blocks. The EEPROM has 4,224 bit lines BL0 to BL4223. It may have less bit lines, for example, 2112 bit lines, nonetheless.

The bit-line control circuit 2 incorporates a plurality of data-storing circuits 9. One data-storing circuit is provided for two bit lines. Alternatively, one data-storing circuit may be provided for one bit line, four bit lines, six bit lines or nine bit lines. The data read from the memory cells into, for example, the data-storing circuit 9 connected to the bit lines BL0 and BL1 is supplied to the data input/output buffer 4 when the signals CSL0 and CSL1 are supplied to the circuit 9 from the column decoder 3. Initial control data is transferred from the data input/output buffer 4 to the data-storing circuit 9 connected to, for example, the bit lines BL2 and BL3, when the signals CSL2 and CSL3 are supplied to this data-storing circuit from the column decoder 3. Each data-storing circuit 9 reads data from the memory cells through one of the two bit lines connected to it and writes data into these memory cells by applying a write-control voltage to the memory cells. The write-control voltage is based on the control data stored in the data-storing circuit 9. Further, the data-storing circuit 9 detects the states of the memory cells connected to one of the two bit lines.

Figure 3A:
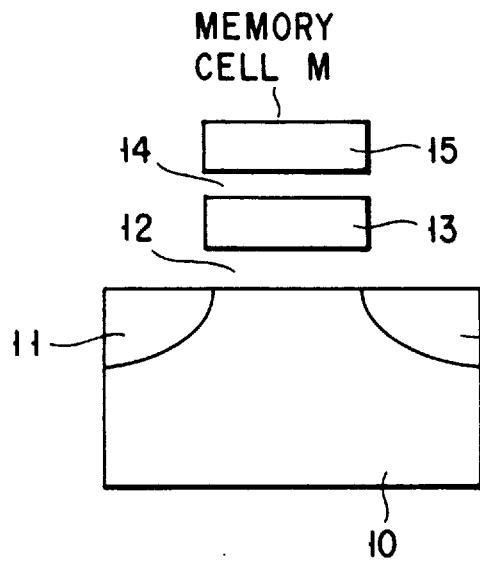
FIG. 3A is a sectional view of one of the memory cells shown in FIG. 2.
Figure 3B:
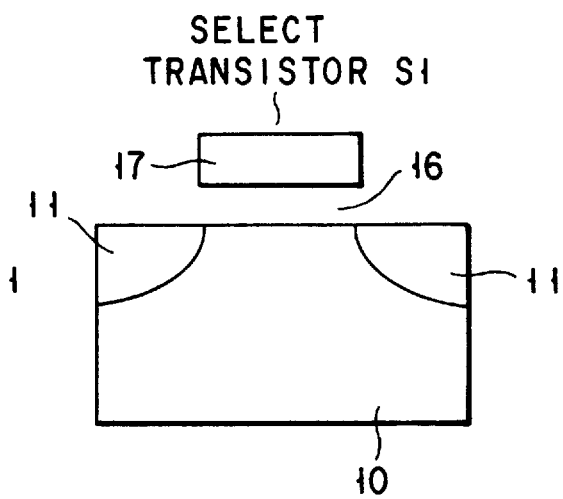
FIG. 3B is a sectional view of one of the select transistors shown in FIG. 2.

FIG. 3A is a sectional view of one of the memory cells M. FIG. 3B is a sectional view of the select transistor S1. It should be noted that the select transistor S1 is identical to the select transistor S2 in structure. As shown in FIG. 3A, the memory cell M is of a MOSFET having a floating gate 13 and a control gate 15. The cell M comprises a p-type semiconductor substrate 10, two impurity-diffused, n-type layers 11 provided in the surface of the substrate 10, and an insulating film 12 provided on that part of the substrate 10 which is located between the n-type layers 11. The floating gate 13 is mounted on the insulating film 12, and an insulating film 14 is provided on the floating gate 13. The control gate 15, which functions a word line, is mounted on the insulting film 14.

As shown in FIG. 3B, the select transistor S1 is of ordinary MOSFET structure. It comprises a p-type semiconductor substrate 10, two impurity-diffused, n-type layers 11 provided in the surface of the substrate 10, an insulating film 16 provided on that part of the substrate 10 which is located between the n-type layers 11, and a gate electrode 17 mounted on the insulating film 16. The gate electrode 17 functions as a select gate SG.

Figure 4:
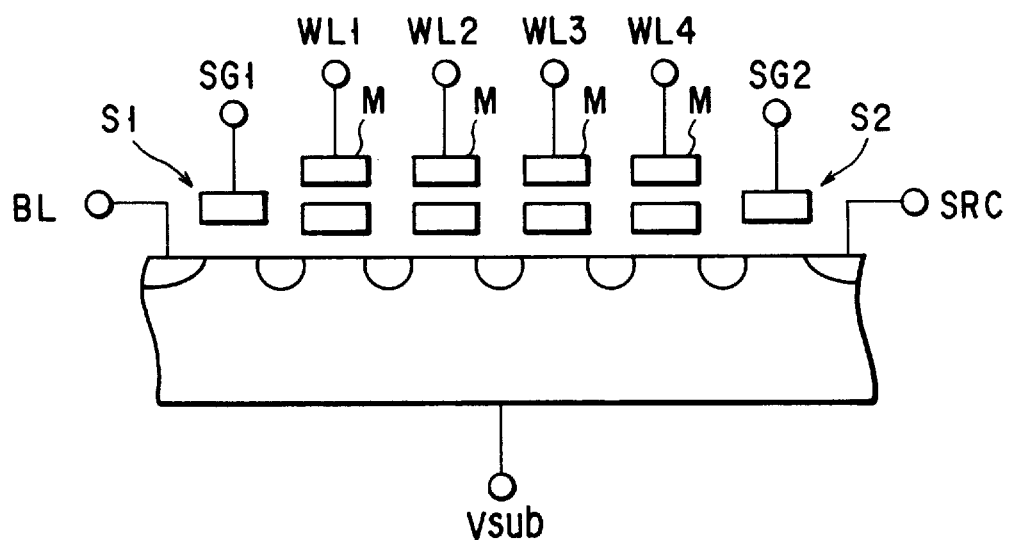
FIG. 4 is a sectional view illustrating one of the NAND-type cell units and two select transistors shown in FIG. 2.

FIG. 4 is a sectional view illustrating one of the NAND-type cell units shown in FIG. 2 and two select transistors S1 and S2. As seen from FIG. 4, the NAND-type cell unit is constituted by four memory cells, whose current paths are connected in series. The cell unit is connected at one end to a common source line SRC by the current path of the select transistor S2, and at the other end to a bit line BL by the current path of the select transistor S1. Assume that the word line WL2 has been selected. Twenty volts (20V) is applied to the word line WL2, 10V to the word lines WL1, WL3 and WL4 which are not selected, the power-supply voltage VCC is applied to the select gate SG1, and 0V to the select gate SG2. Data is thereby written into the NAND-type cell unit.

Assuming that the EEPROM is a four-value storing one, the bit line is set at 0V to write data "1", "2" or "3" into each memory cell M of the NAND-type cell unit. Electrons are thereby injected into the floating gates of the memory cell M. The threshold voltage of the memory cell M becomes positive. To write data "0" into the memory cell M, the bit line BL is set at the power-supply voltage VCC. In this case, no electrons are injected into the floating gate of the memory cell M. Voltages other than 0V may be applied to the bit line BL in order to write data "1", "2" or "3" into the memory cell. For example, 0.8V may be applied to the bit line BL to write data "1" into the memory cell M, and 0V may be applied to the bit line BL to write data "2" or "3" thereinto. This is because it suffices to inject less electrons into the floating gate of the memory cell M to store data "1" than to store data "2" or "3". Moreover, different voltages may be applied to the bit line BL in order to write data "1", data "2" and data "3", respectively, into the memory cell M. These voltages may be, for example, 1.6V, 0.8V and 0V.

To erase the data in the memory cells M of the NAND-type cell unit, the substrate voltage Vsub is set at 20V, and the select gates SG1 and SG2, source line SRC and bit line BL are set at 20V. When the word lines WL1 to WL4 of a block are set at 0V to erase data in this block, electrons are released from the floating gates of the memory cells M constituting this block. As a result, the threshold voltages of the memory cells M becomes negative (thus, storing data "0"). No electrons are released from the floating gates of the memory cells M when the word lines of any other block are set at 0V to erase data in the other block. When the word lines of a block in which no data is to be erased are set at 0V, no electrons are released from the floating gates of the memory cells constituting the block.

In the case where the EEPROM is a four-value storing one, the memory-cell has its threshold voltage set at 0V or less to store data "0", at 0.4 to 0.8V to store data "1", at 1.2 to 1.6V to store data "2", and at 2.0 to 2.4V to store data "3". To read data from, for example, the memory cell M connected to the word line WL2 (FIG. 4), the word line WL2 (i.e., the selected word line) is set at read voltage Vread. In this case, the word lines WL1, WL3 and WL4 which are not selected are set at the power-supply voltage VCC (e.g., 3.3V), the select gates SG1 and SG2 are set at the power-supply voltage VCC, and the source line SRC is set at 0V.

(1) When the read voltage Vread is 0V, the voltage on the bit line BL which has been charged to the power-supply voltage VCC and set in floating state remains at the voltage VCC if the selected memory cell M stores data "1", "2" or "3". In this case, the voltage on the bit line BL falls to 0V if the selected memory cell M stores data "0".

(2) When the read voltage Vread is 1V, the voltage on the bit line BL which has been charged to the power-supply voltage VCC and set in floating state remains at the voltage VCC if the selected memory cell M stores data "2" or "3". In this case, the voltage on the bit line BL falls to 0V if the selected memory cell M stores data "0" or "1".

(3) When the read voltage Vread is 1.8V, the voltage on the bit line BL which has been charged to the power-supply voltage VCC and set in floating state remains at the voltage VCC if the selected memory cell M stores data "3". In this case, the voltage on the bit line BL falls to 0V if the selected memory cell M stores data "0", "1" or "2".

As may be understood from the paragraphs (1) to (3), the data stored in any memory cell M can be determined by detecting the voltage which is applied on the bit line BL when the read voltage Vread is changed.

FIG. 5 shows in detail a part of the memory cell array 1 and one of the data-storing circuits 9. More specifically, it illustrates two NAND-type cell units connected to the bit lines BLi and BLi+1 and the data-storing circuits connected to the bit lines BLi and BLi+1. The data-storing circuit 9 is designed on the assumption that the memory shown in FIG. 1 is a four-value storing EEPROM.

The data-storing circuit comprises first and second sub-data circuits 20 and 21. To write data into any selected memory cell, each sub-data circuit stores data "0" or "1", converts the sub-data "1" stored in the cell when the bit line signal is at high level, to sub-data "0", and holds the sub-data "0". To read the data from the selected memory cell, the sub-data circuit stores data "0" or "1", converts the sub-data "1" stored in the cell when the bit line signal is at high level, to sub-data "0", and holds the sub-data "0".

The first sub-data circuit 20 comprises two p-channel MOS transistors Qp1 and Qp2 and six n-channel MOS transistors Qn1 to Qn6. The second sub-data circuit 21 comprises two p-channel MOS transistors Qp4 and Qp5 and six n-channel MOS transistors Qn10 to Qn16. P-channel MOS transistors Qp3 and Qp6 are provided to reset the first sub-data circuit 20 and the second sub-data circuit 21, respectively. When the first sub-data circuit 20 is reset, a node Ni in the circuit 20 is set at "H" level. While the node Ni remains at "H" level, the first sub-data circuit 20 keeps storing first data "1" to be read out, or first sub-data "1". When the second sub-data circuit 21 is reset, a node Ni+1 in the circuit 21 is set at "H" level. While the node Ni+1 remains at "H" level, the second sub-data circuit 21 keeps storing second data "1" to be read out, or second sub-data "1". As long as the node Ni remains at "L" level, the first sub-data circuit 20 keeps storing first data "0" to be read out, or first sub-data "0". Similarly, as long as the node Ni+1 remains at "L" level, the second sub-data circuit 21 keeps storing second data "0" to be read out, or second sub-data "0".

The n-channel MOS transistors Qn5 and Qn14 are provided to electrically connect the sub-data circuits 20 and 21, respectively, to the input/output line IO. The gate electrode of the n-channel MOS transistor Qn5 receives an output signal CSLi output from the column decoder 3. The gate electrode of the n-channel MOS transistor Qn14 receives an output signal CSLi+1 output from the column decoder 3. When the signal CSLi changes to "H" level, the first sub-data circuit 20, which is incorporated in the data-storing circuit 9 connected to the bit lines BLi and BLi+1, is electrically connected to the input/output line IO. The data input/output line IO is connected to the data input/output buffer 4 shown in FIG. 1. The sub-data to be read out can be thereby output to the data input/output buffer 4. The data input/output line IO is provided to input data to, and output data from, all data-storing circuits 9 shown in FIG. 2.

The n-channel MOS transistor Qn7 controls the electrical connection of the first sub-data circuit 20 to the bit line BLi. The n-channel MOS transistor Qn17 controls the electric connection of the second sub-data circuit 20 to the bit line BLi+1. Signals BLC1 and BLC2 are supplied to the MOS transistors Qn7 and Qn17, respectively. While the signals BLC1 and BLC2 remain at "H" level and "L" level, respectively, both sub-data circuits 20 and 21 are electrically connected to the bit line BLi. On the other hand, while the signals BLC1 and BLC2 remain at "L" level and "H" level, respectively, both sub-data circuits 20 and 21 are electrically connected to the bit line BLi+1.

The n-channel MOS transistor Qn8 controls the electrical connection of the bit line BLi to a voltage source VBL1. The n-channel MOS transistor Qn18 controls the electrical connection of the bit line BLi+1 to a voltage source VBL2. Signals PRE1 and PRE2 are supplied to the MOS transistors Qn8 and Qn18, respectively. While the signal PRE1 remains at "H" level, the bit line BLi is electrically connected to the voltage source VBL1. Similarly, while the signal PRE2 remains at "H" level, the bit line BLi+1 is electrically connected to the voltage source VBL2.

A signal CMOD is supplied to the n-channel MOS transistor Qn9. While the signal CMOD remains at "H" level, the MOS transistor Qn9 electrically connects the first sub-data circuit 20 and the second sub-data circuit 21 to each other. The data-storing circuit 9 controls the storing of four-value data, thus controlling either the bit line BLi or the bit line BLi+1. On the other hand, while the signal CMOD remains at "L" level, the MOS transistor Qn9 electrically disconnects the first sub-data circuit 20 and the second sub-data circuit 21 from each other. In this case, the sub-data circuits 20 and 21 function as independent data-storing circuits, each controlling the storing of two-value data. That is, the first sub-data circuit 20 controls the bit line BLi, whereas the second sub-data circuit 21 controls the bit line BLi+1.

The signals BLC1, BLC2, PRE1, PRE2, VBL1, VBL2, and CMOD are generated by the control signal/voltage generating circuit 7 shown in FIG. 1. The circuit 7 generates other signals RST, SEN1, SEN2, PRO1, PRO2 and REG. The signals the circuit 7 generates are supplied to all data-storing circuits 9 shown in FIG. 2. The power-supply voltage VCC is, for example, 3.3V. The signal CMOD can be switched between "H" level and "L" level by a control signal supplied to the control signal input terminal 8. Alternatively, the signal CMOD can be set at "H" level or "L" level in accordance with a control signal or data stored in the control signal/voltage generating circuit 7.

In the first sub-data circuit 20, a signal at "H" level signal on the bit line BLi may be supplied to the gate electrode of the n-channel MOS transistor Qn4 while the signal SEN1 supplied to the n-type MOS transistor Qn3 remains at "H" level. If so, the MOS transistor Qn4 is turned on, whereby the node Ni is set at "L" level. The sub-data "1" to be read out is thereby changed to sub-data "0". The sub-data "0" to be read remains unchanged because the node Ni is now at "L" level. As long as the bit line BLi is at "L" level, the MOS transistor Qn4 is off, whereby the sub-data to be read out is not changed.

In the second sub-data circuit 21, a signal at "H" level signal on the bit line BLi+1 may be supplied to the gate electrode of the n-channel MOS transistor Qn13 while the signal SEN2 supplied to the n-type MOS transistor Qn12 remains at "H" level. If so, the MOS transistor Qn13 is turned on, whereby the node Ni+1 is set at "L" level. The sub-data "1" to be read out is thereby changed to sub-data "0". The sub-data "0" to be read remains unchanged because the node Ni+1 is now at "L" level. As long as the bit line BLi+1 is at "L" level, the MOS transistor Qn13 is off, whereby the sub-data to be read out is not changed.

The first sub-data circuit 20 and the second sub-data circuit 21 may be replaced by various circuits which are designed to perform the same function as the circuits 20 and 21.

Figure 6:
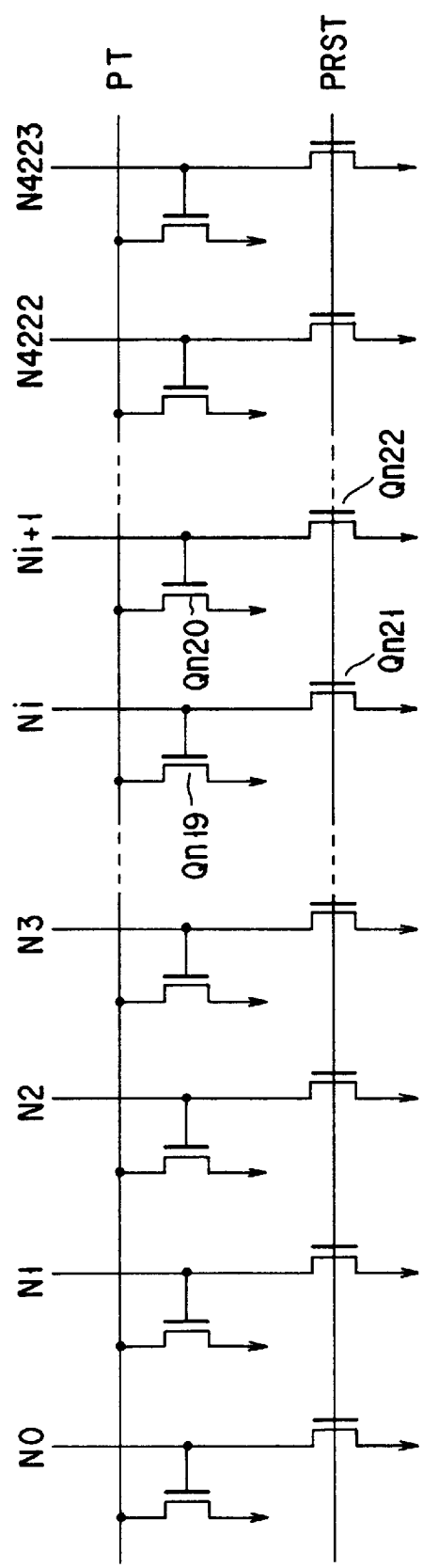
FIG. 6 is a circuit diagram of the circuit peripheral to the data-storing circuit shown in FIG. 5.

FIG. 6 illustrates the circuit peripheral to the data-storing circuit 9 which is shown in FIG. 5. The peripheral circuit comprises n-channel MOS transistors Qn19 to Qn22 and a signal line PT. The gate electrode of the MOS transistor Qn19 is connected to the node Ni in the first sub-data circuit 20. Also connected to the node Ni is one end of the current path of the MOS transistor Qn21. The gate electrode of the MOS transistor Qn20 is connected to the node Ni+1 in second sub-data circuit 21. Connected to the node Ni+1 is one end of the current path of the MOS transistor Qn22. The n-channel MOS transistors Qn19 and QN20 constitute a circuit for detecting whether or not all sub-data circuits store sub-data items "0". If all sub-data circuits store sub-data items "0", the signal line PT is not set at the ground potential. If any one of the sub-data circuits stores sub-data "1", the signal line PT is set at the ground potential. The n-channel MOS transistors Qn21 and Qn22 constitute a circuit for storing sub-data "0" into all sub-data circuits. Sub-data "0" is stored into 4,224 sub-data circuits when a signal PRST rises to "H" level.

How four-value data is read from the memory cells of the EEPROM will be explained, with reference to the timing chart of FIG. 7. Let us assume that one of the bit lines BL0 to BL4222, i.e., bit line BLi, is selected, that the word line WL2 is selected, that the signal CMOD is set at "H" level to read four-value data. If three data-storing levels are provided, three-value data can be read from the memory cells of the EEPROM.

First, the signal PRE1 is set at "L" level at time t1, disconnecting the bit line BLi from the voltage source VBL1. At the same time, the signal BLC1 is set at "H" level, whereby the bit line BLi is selected. Then, the sub-data circuits 20 and 21 are reset by the signal RST and store the first sub-data "1" and the second sub-data "1", respectively, for the period between time t1 and time t2.

At time t2, the signal REG rises to "H" level, and the second sub-data circuit 21 electrically charges the bit line BLi to "H" level. The bit line BLi remains at "H" level for the period between the time t2 and the time t3. At time t3, the select gate lines SG1 and SG2 of the selected block and the word lines WL1, WL3 and WL4 not selected are set at the power-supply voltage VCC. As a result, the word line WL2 selected is set at 1.8V, at time t3.

Table 1 presented below shows the relationship between the four data items each memory cell M can store and the threshold voltages the memory cell has to store the four data items, respectively.

TABLE 1

| Data Item | Threshold Voltage |
| --- | --- |
| 0 | 0 V or less |
| 1 | 0.4 V–0.8 V |
| 2 | 1.2 V–1.6 V |
| 3 | 2.0 V–2.4 V |

Figure 7:
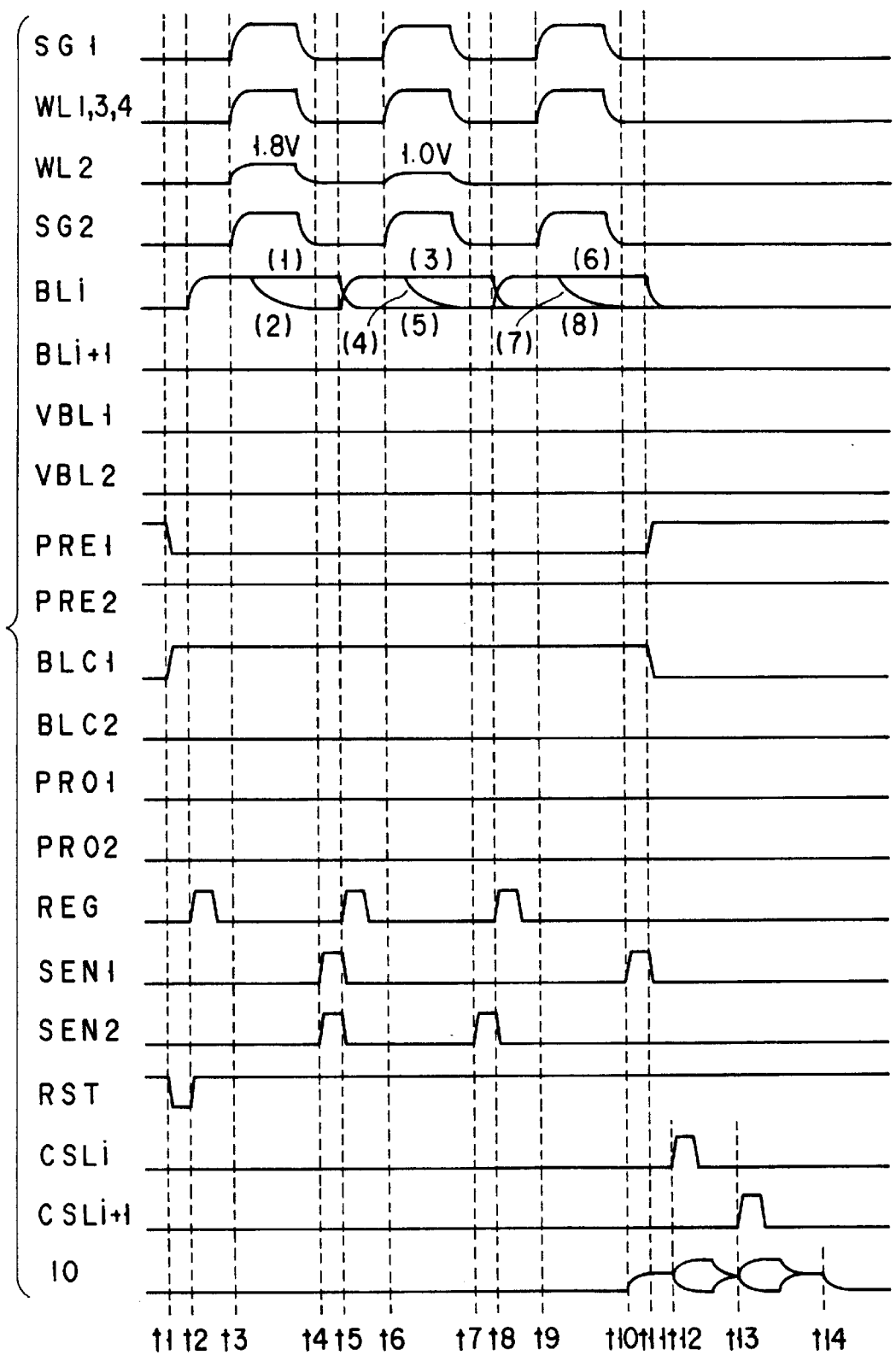
FIG. 7 is a timing chart for explaining how four-value data is read from the memory cells of the device according to the first embodiment of the invention.

When the potential of the word line WL2 increases to 1.8V, the bit line BLi remains at "H" level as indicated at "1" in FIG. 7 if the memory cell M stores data item "3". If the memory cell M stores any other data item (i.e., "0", "1" or "2"), the bit line BLi will be set at "L" level as indicated at (2) in FIG. 7. Then, the signals SEN1 and SEN2 are set at "H" level, whereby the voltage on the bit line BLi is read during the period between time t4 and time t5. Only when the memory cell M stores data "3", the first and second sub-data items stored in the sub-data circuits 20 and 21, respectively, changes to "0." In any other case, they remain "1".

At time t5, the signal REG rises to "H" level. The bit line BLi is thereby electrically charged to "H" level by the second sub-data circuit 21 only if the second sub-data to be read out is "1". The bit line BLi remains at "H" level for the period between time t5 and time t6. If the second sub-data to be read out is "1", the bit line BLi is charged to "L" level by the second sub-data circuit 21, as indicated at (5) in FIG. 7. Then, at time t6, the select gate lines SG1 and SG2 of the selected block and the word lines WL1, WL3 and WL4 not selected are set at the power-supply voltage VCC. The word line WL2 selected is thereby set at 1.0V, at time t6.

When the word line WL is set at 1.0V, the bit line BLi remains at "H" level only if the memory cell M stores data "2", as is shown at (3) in FIG. 7. If the memory cell M stores either "1" or "0", the bit line BLi will be set at "L" level as indicated at (4) in FIG. 7. Next, the signal SEN2 is set at "H" level, whereby the voltage on the bit line BLi is read during the period between time t7 and time t8. Only when the memory cell M stores data "2", is the second sub-data item stored in the second sub-data circuit 21 changed from "1" to "0." When the memory cell M stores "1" or "0", the sub-data item to be read out remains "1". When the memory cell M stores "3", the second sub-data item to be read out is already "0".

When the signal REG rises to "H" level at time t8, the bit line BLi is charged to "H" level by the second sub-data circuit 21 only if the second sub-data to be read out is "1". The bit line BLi remains at "H" level until time t9. On the other hand, if the second sub-data is "0", the bit line BLi is charged to "L" level by the second sub-data circuit 21. In this case, the bit line BLi remains at "H" level for the period between time t8 and time t9, as is shown at (8) in FIG. 7. Then, at time t9, the select gate lines SG1 and SG2 of the selected block and the word lines WL1, WL3 and WL4 not selected are set at the power-supply voltage VCC, whereby the word line WL2 selected is set at 0V at time t9.

When the word line WL2 selected is set at 0V, the bit line BLi remains at "H" level as indicated at (6) in FIG. 7, only if the memory cell M stores data "2". If the memory cell M stores "0", the bit line BLi will be set at "L" level as illustrated at (7) in FIG. 7. The signal SEN1 is then set at "H" level, whereby the voltage on the bit line BLi is read during the period between time t10 and time t11. Only when the memory cell M stores data "1", is the first sub-data item stored in the first sub-data circuit 20 changed from "1" to "0." As long as the memory cell M stores "0", the first sub-data item to be read remains "1". When the memory cell M stores "3", the first sub-data item to be read out is already "0". When the memory cell M stores "2", the first sub-data item to be read remains "1" because the bit line BLi is at "L" level.

When the signal CSLi is set at "H" level, the first sub-data is output to the data input/output line IO. The signal CSLi is further supplied via the data input/output buffer 4 to the input/output terminal 5 and finally output to the external device. When the signal CSLi+1 is set at "H" level, the second sub-data is output to the data input/output line IO.

The signal CSLi+1 is then supplied via the data input/output buffer 4 to the input/output terminal 5 and finally output to the external device.

While the data is being read, the bit line BLi+1 not selected remains at the voltage VBL2 which is, for example, 0V.

Table 2 presented below shows the relationship between the four data items each memory cell M can store, the values the first sub-data can have and the values the second sub-data can have.

TABLE 2

| Data in Cell | First Sub-Data | Second Sub-Data |
| --- | --- | --- |
| 0 | 1 | 1 |
| 1 | 0 | 1 |
| 2 | 1 | 0 |
| 3 | 0 | 0 |

Figure 8:
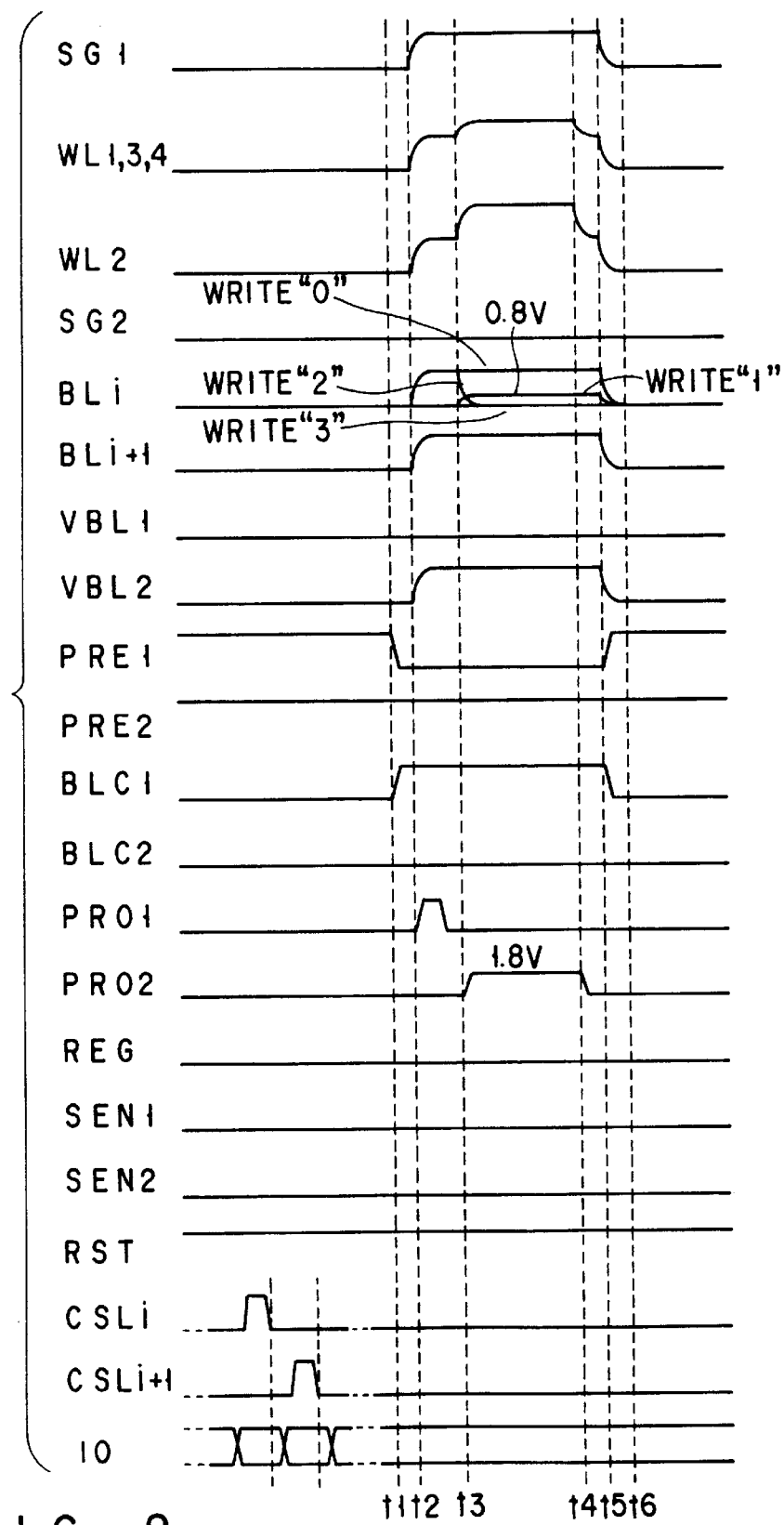
FIG. 8 is a timing chart for explaining how control data is set in, and data is written into, each data-storing circuit incorporated in the first embodiment.

How initial control data is set in, and data is written into, each data-storing circuit 9 will be explained, with reference to the timing chart of FIG. 8. Let us assume that one of the bit lines BL1 to BL4222, i.e., bit line BLi, is selected, that the word line WL2 is selected, that the signal CMOD is set at "H" level to read four-value data. If three data-storing levels are provided, three-value data can be read from the memory cells of the EEPROM.

Initial control data is set in the data-storing circuit 9 connected to the bit line BLi selected, in the following way. First, the initial sub-data item to be set in the first sub-data circuit 20 is transferred to the data input/output line IO. The signal CSLi is set at "H" level, whereby the initial sub-data item is stored into the first sub-data circuit 20. Then, the initial sub-data item to be set in the second sub-data circuit 21 is transferred to the data input/output line IO. The signal CSLi+1 is set at "H" level, whereby the initial sub-data item is stored into the second sub-data circuit 21. The initial control data and the initial sub-data items set in the sub-data circuits 20 and 21 have the relationship shown in Table 3.

TABLE 3

| Initial Control Data | Initial Sub-Data in Circuit 20 | Initial Sub-Data in Circuit 21 |
| --- | --- | --- |
| 0 | 0 | 0 |
| 1 | 1 | 0 |
| 2 | 0 | 1 |
| 3 | 1 | 1 |

It is desired that the signal RST be set at "H" level before control data items are set in all data-storing circuits 9, thereby to reset the control data items to "0". The state of each memory cell M cannot be changed by control data item "0", as will be described later. It suffices to set initial control data items supplied from an external device, in only the desired ones of the data-storing circuits 9. Needless to say, initial control data items may be set in all 2112 data-storing circuits from the external device.

To write data to the data-storing circuit 9 connected to the bit lines BLi and BLi+1, the bit line BLi which receives the signal PRE1 at "L" level is disconnected from the voltage source VBL1 at time t1. Simultaneously, that is, at time t1, the signal BLC1 rises to "H" level, selecting the bit line BLi. At time t2, the voltage VBL2 is set at VCC. The bit line BLi+1 not selected is thereby charged to VCC through the n-channel MOS transistor Qn18, until time t3. At time t2, too, the signal PRO1 rises to "H" level, whereby the bit line BLi selected is charged in accordance with the first sub-data during the period between time t2 and time t3. More precisely, the bit line BLi is charged to VCC if the control data is "0" or "2". If the control data is either "1" or "3", the bit line BLi is set at 0V. During the period between time t2 and time t3, the select gate line SG1 and the word lines WL1 to WL4 are set at VCC. At time t3, the signal PRO2 is set at 1.8V, and the voltage on the bit line BLi selected is changed in accordance with the second sub-data. If the second sub-data is "0", the n-channel MOS transistor Qn16 is off. In this case, the bit line BLi remains at VCC. If the second sub-data is "1", the MOS transistor Qn16 is on. The bit line BLi is therefore set at 0V.

Thus, the bit line BLi is set at VCC if the control data is "0", at 0.8V if the control data is "1", at 0V if the control data is "2", and also at 0V if the control data is "3". At time t3, the word line WL2 selected is set at 20V and the word lines not selected are set at 10V. Electrons are thereby injected into the floating gate of the memory cell in on the basis of the control data, until time t4. If the bit line BL is at 0V, the potential difference between the channel of the memory cell and the word line WL2 is 20V, and electrons are injected into the floating gate of the memory cell. If the bit line BL is at 0.8V, said potential difference is 19.2V. Thus, electrons are injected into the floating gate of the memory cell, but in smaller numbers than in the case where the potential difference is 20V. If the bit line BL is set at VCC, the potential difference between the channel of the memory cell and the word line WL2 is so small that virtually no electrons are injected into the floating gate of the memory cell. The word lines WL1 to WL4 remain at VCC during the period between time t4 and time t5. At time t5, the voltage VBL2 changes to 0V and the signal PRE1 is set at "H" level. The bit lines BLi and BLi+1 are reset to 0V and remain at 0V until time t6. During the period between time t5 and time t6, the voltage VBL1 remains at 0V, and the word lines WL1 to WL4 remains reset at 0V, too.

After the data-writing operation performed at time t1 to time t6 (FIG. 8), write verification is effected to detect whether or not the data has been written into the memory cell. How the write verification is carried out will be explained, with reference to the timing chart of FIG. 9. Here, assume that one of the bit lines BL1 to BL4222, i.e., bit line BLi, is selected, that the word line WL2 is selected, that the signal CMOD is set at "H" level to store four-value data. If three data-storing levels are provided, three-value data can be stored in the memory cells of the EEPROM. At the same time, the bit line BLi connected to the circuit 9 storing control data items "1" and "0" is set at "L" level by the second sub-data circuit 21 and remains at "L" level until time t3. At time t3, the select gate lines SG1 and SG2 of the selected block and the word lines WL1, WL3 and WL4 not selected are set at the power-supply voltage VCC, whereas the word line WL2 selected is set at 2.0V.

Figure 9:
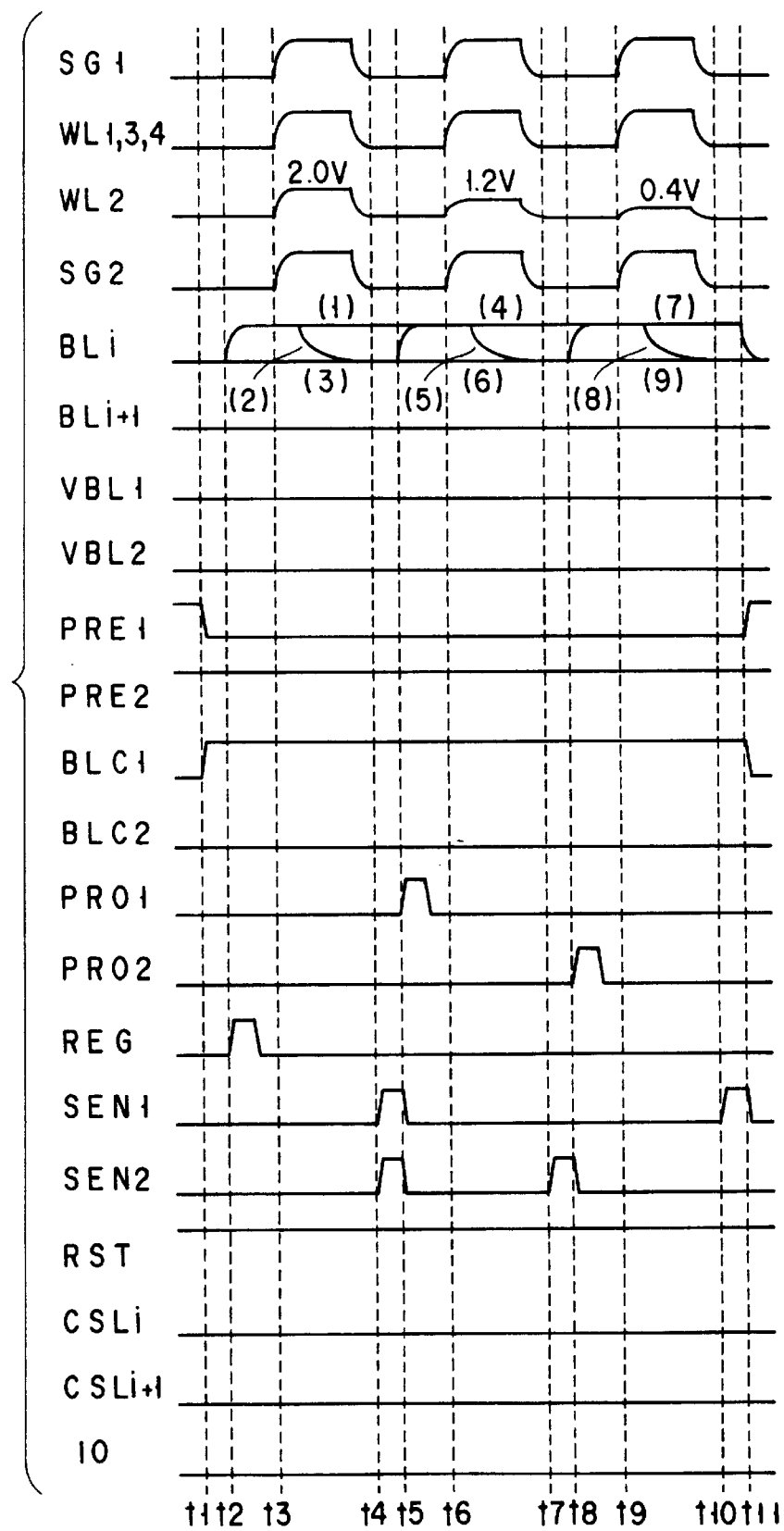
FIG. 9 is a timing chart for explaining how write verification is performed to determine whether data has been written into the memory device according to the first embodiment.

When the word line WL2 is set at 2.0V, the bit line BLi remains at "H" level as indicated at (1) in FIG. 9, if the memory cell M connected to the circuit 9 storing control data "3" has assumed the state of storing data "3". If this memory cell M has not assumed the state of storing data "3", the bit line BLi is set at "L" level as illustrated at (2) in FIG. 9. Since the memory cell M connected to the circuit 9 storing control data "2" has not taken the state of storing data "3", the bit line BLi is set at "L" level as is shown at (2) in FIG. 9. The bit line BLi connected to the circuit 9 storing control data items "1" and "0" remains at "L" level as indicated at (3) in FIG. 9.

At time t4, the signals SEN1 and SEN2 are set at "H" level, whereby the voltage on the bit line BLi is read until time t5. Only when the memory cell M assumes the condition of storing data "3", the first and second sub-data items stored in the sub-data circuits 20 and 21, respectively, changes to "0." In any other case, the sub-data items remain "1".

At time t5, the signal PRO1 rises to "H" level. The bit line BLi connected to the data-storing circuit 9 storing control data items "2" and "0" is thus electrically charged to "H" level by the first sub-data circuit 20 and remains at "H" level until time t6. On the other hand, the bit-line BLi connected to the circuit 9 storing control data items "3" and "1" is set at "L" level by the first sub-data circuit 20 and remains at "L" until time t6. At time t6, the select gate lines SG1 and SG2 of the selected block and the word lines WL1, WL3 and WL4 not selected are set at the power-supply voltage VCC. The word line WL2 selected is thereby set at 1.2V.

When the word line WL2 is set at 1.2V, the bit line BLi remains at "H" level as shown at (4) in FIG. 9, if the memory cell M connected to the data-storing circuit which stores control data item "2" has assumed the state of storing data "2". If this memory cell M has not assumed the state of storing data "2", the bit line BLi is set at "L" level as is illustrated at (5) in FIG. 9. If the memory cell M connected to the data-storing circuit which stores control data item "0" has taken the state of storing data item "2" or "3", the bit line BLi remains at "H" level as indicated at (4) in FIG. 9. If this memory cell M has not assumed the state of storing data item "2", the bit line BLi is set at "L" level as shown at (5) in FIG. 9. The bit line BLi connected to the circuit 9 storing data items "3" and "1" remains at "L" level as is illustrated at (6) in FIG. 9. At time t7, the signal SEN1 is set at "H" level, whereby the voltage on the bit line BLi is read during the period between time t7 and time t8. Only when the memory cell M connected to the data-storing circuit 9 storing control data item "2" has taken the state of storing data item "2", is the second sub-data stored in the second sub-data circuit 21 changed to "0". In any other case, the second sub-data remains unchanged.

At time t8, the signal PRO2 rises to "H" level, the bit line BLi connected to the circuit 9 storing control data items "1" and "0" is charged to "H" level by the second sub-data circuit 21. The bit line BLi remains at "H" level until time t9. Meanwhile, the bit line BLi connected to the circuit 9 storing control data items "3" and "2" is set at "L" level by the second sub-data circuit 21. This bit line BLi remains at "L" level during the period between time t8 and time t9. At time t9, the select gate lines SG1 and SG2 of the selected block and the word lines WL1, WL3 and WL4 not selected are set at the power-supply voltage VCC. The word line WL2 selected is thereby set at 0.4V.

When the word line WL2 is set at 0.4V, the bit line BLi remains at "H" level as indicated at (7) in FIG. 9, if the memory cell M connected to the circuit 9 storing control data item "1" has assumed the state of storing data item "1". The bit line BLi is set at "L" level as shown at (8) in FIG. 9, if this memory cell has not taken yet the state of storing data item "1". The bit line BLi remains at "H" level as illustrated at (7) in FIG. 9, if the memory cell M connected to the circuit 9 storing control data item "0" has assumed the state of storing data item "1", "2" or "3". The bit line BLi is set at "L" level as shown at (8) in FIG. 9, if this memory cell M has not assumed the state of storing data item "1". The bit line BLi connected to the circuit 9 storing control data items "3" and "2" remains at "L" level, as is indicated at (9) in FIG. 9. At time t10, the signal SEN1 is set at "H" level, whereby the voltage on the bit line BLi is read during the period between time t10 and time t11. Only when the memory cell M connected to the data-storing circuit 9 storing control data item "1" has taken the state of storing data item "1", is the first sub-data stored in the first sub-data circuit 20 changed to "0". In any other case, the first sub-data remains unchanged.

When the write verification (WV) described above is carried out, the control data items stored in the data-storing circuit 9 is changed in accordance with the data-storing states of the memory cells, as is shown in the following Table 4:

TABLE 4

| Data-Storing State of Memory Cell | Control Data before WV | Control Data after WV |
|---|---|---|
| 0, 1, 2 or 3 | 0 | 0 |
| Not yet for 1 | 1 | 1 |
| 1 | 1 | 0 |
| Not yet for 2 | 2 | 2 |
| 2 | 2 | 0 |
| Not yet for 3 | 3 | 3 |
| 3 | 3 | 0 |

As may be well understood from Table 4, the write verification is effected by electrically charging the bit lines BL in accordance with the control data items stored in the data-storing circuits 9. The control data items stored in any data-storing circuit can thereby be changed easily. This helps to simplify the circuit structure of the EEPROM. The EEPROM can therefore be manufactured at low cost.

Data items are written into the memory cells by repeating the data-writing operation (time t1 to time t6, FIG. 8) and the write verification (FIG. 9) until all control data items stored in the data-storing circuits 9 change to "0". The data-storing state of a memory cell M does not change if the cell M is connected to a circuit 9 which stores the initial control data item "0". The memory cell M assumes the data of storing data item "1" if it is connected to a circuit 9 storing the initial control data item "1", assumes the data of storing data item "2" if it is connected to a circuit 9 storing the initial control data item "2", and assumes the data of storing data item "3" if it is connected to a circuit 9 storing the initial control data item "3". Whether all control data items are "0" can be determined by detecting whether the signal line PT (FIG. 6) is set at the ground potential. This is because the line PT is not set at the ground potential when all control data items are "0". The voltage on any word line WL selected to write data may be gradually increased.

How two-value data is read from the memory cells of the EEPROM will be explained, with reference to the timing chart of FIG. 10. Here it is assumed that two of the bit lines BL1 to BL4223, i.e., bit lines BLi and BLi+1, are selected, that the word line WL2 is selected, that the signal CMOD is set at "L" level to read two-value data.

At first, the signals BLC1 and BLC2 are set at "H" level at time t1, thus selecting the bit lines BLi and BLi+1. The first and second sub-data items, both being "1", are set in the first and second sub-data circuits 20 and 21, respectively, in accordance with the signal RST during the period between time t1 and time t2.

At time t2, the voltages VBL1 and VBL2 are set at VCC, whereby the bit lines BLi and BLi+1 are charged to "H" level during the period between time t2 and time t3. At time t3, the signals PRE1 and PRE2 are set at "L" level, disconnecting the bit lines BLi and BLi+1 from the voltage sources VBL1 and VBL2, respectively. Also at time t3, the select gate lines SG1 and SG2 of the selected block and the word lines WL1, WL3 and WL4 not selected are set at the power-supply voltage VCC. The word line WL2 selected is thereby set at 0V.

Table 5 presented below shows the relationship between the data the memory cell M stores and the threshold voltage the cell M has:

TABLE 5

| Data in Cell | Threshold Voltage of Cell |
| --- | --- |
| 0 | 0 V or less |
| 1 | 0.4 V–0.8 V |

If the memory cell M keeps storing data "1" during the period between time t3 and time t4, the bit line BLi or BLi+1 remains at "H" level. If the memory cell M keeps storing data "0" during this period, the bit line BLi or BLi+1 is set at "L" level. Then, the signals SEN1 and SEN2 are set at "H" level, whereby the voltage on the bit line BLi or BLi+1 is read during the period between time t4 and time t5. If the memory cell M stores data "1", the first sub-data or the second sub-data changes to "0". On the other hand, if the memory cell M stores data "0", the first sub-data or the second sub-data remains at value "0".

When the signal CSLi is set at "H" level, the first sub-data is output to the external device through the data input/output line IO, the data input/output buffer 4 and to the input/output terminal 5. When the signal CSLi+1 is set at "H" level, the second sub-data is output to the external device through the data input/output line IO, the data input/output buffer 4 and to the input/output terminal 5.

The first sub-data circuit 20 and the second sub-data circuit 21 operate as independent data-storing circuits, in order to read two-value data as explained with reference to FIG. 10. The first sub-data stored in the circuit 20 is identical to the data stored in the memory cell connected to the circuit 20, and the second sub-data stored in the circuit 21 is identical to the data stored in the memory cell connected to the circuit 21.

Figure 11:
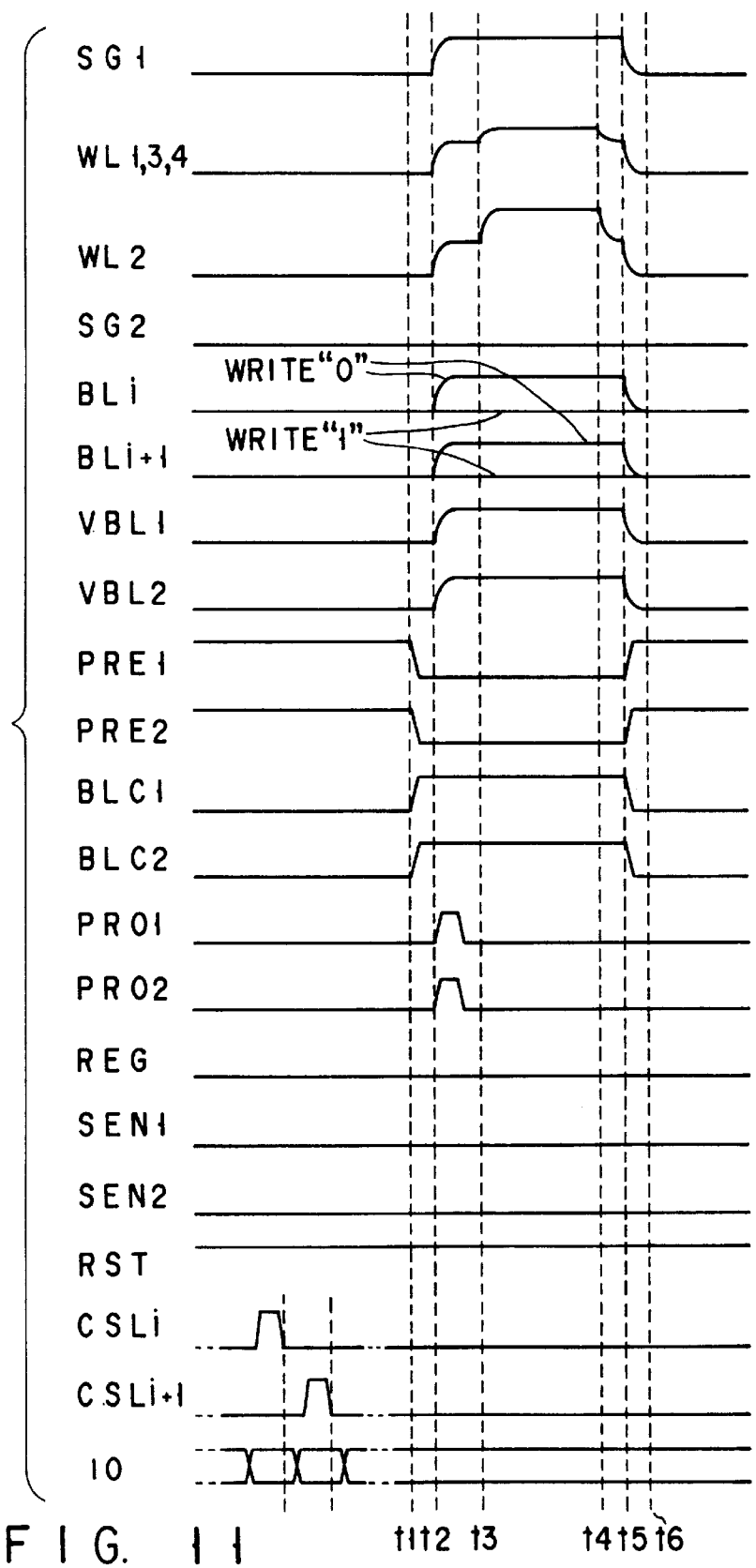
FIG. 11 is a timing chart for explaining how initial sub-data is set in each sub-data circuit and how data is written into memory cells in the memory device according to the first embodiment.

With reference to a timing chart of FIG. 11 it will be explained how initial sub-data items are set in the sub-data circuits 20 and 21 and how data is written into memory cells M. Let us assume that two of the bit lines BL1 to BL4223, i.e., bit lines BLi and BLi+1, are selected, that the word line WL2 is selected, that the signal CMOD is set at "L" level to write two-value data into the memory cells M. In this case, the first sub-data circuit 20 and the second sub-data circuit 21 operate as independent data-storing circuits, and the first sub-data and the second sub-data stored in the circuits 20 and 21 function as control data items used to write data items into the memory cells M connected to the circuits 20 and 21, respectively.

The initial sub-data items are set in the sub-data circuits 20 and 21 as follows. First, the initial sub-data to be set in the circuit 20 is transferred to the data input/output line IO. The signal CSLi is set at "H" level, whereby the initial sub-data is stored into the first sub-data circuit 20. Then, the initial sub-data to be set in the circuit 21 is transferred to the data input/output line IO. The signal CSLi+1 is set at "H" level, whereby this initial sub-data is stored into the second sub-data circuit 21.

It is desired that the signal RST be set at "H" level, thereby to reset the sub-data items to "0" before the initial sub-data items are set in the circuits 20 and 21. As will be described later, the sub-data items "0" do not alter the state of the memory cells M. Hence, it suffices to supply initial sub-data items to the EEPROM from the external device and set them into only desired ones of the 4224 sub-data circuits provided in the EEPROM. Instead, initial sub-data items may of course be set in all 2224 sub-data circuits from the external device.

To write data items into the memory cells M, the signals PRE1 and PRE2 are set at "L" level at time t1, thereby disconnecting the bit lines BLi and BLi+1 from the voltage sources VBL1 and VBL2, respectively. Also at time t1, the signals BLC1 and BLC2 are set at "H" level, thus selecting the bit lines BLi and BLi+1. At time t2, the signals PRO1 and PRO2 are set at "H" level. As a result, the bit lines BLi and BLi+1 are charged until time t3 in accordance with the first sub-data and the second sub-data, respectively. More precisely, the bit line BLi is charged to VCC if the first sub-data is "0". If the first sub-data is "1", the bit line BLi is charged to 0V. The select gate SG1 and the word lines WL1 to WL4 are set at VCC during the period between t2 and time t3. At time t3, the word line WL2 selected is set at 20V, whereas the word lines not selected, WL1, WL3 and WL4, are set at 10V. The word lines WL1 to WL4 remain at these voltages until time t4. During the period between time t3 and time t4, electrons are injected into the floating gates of the memory cells, in numbers which accord with the sub-data items. If the bit line BL is set at 0V, electrons are injected to the floating gate of any cell M connected to the bit line BL, providing a potential difference of 20V between the word line WL and the channel of the memory cell M. If the bit line BL is set at VCC, the potential difference is so small that virtually no electrons are injected into the floating gate of the memory cell M. The voltage on the word lines WL1 to WL4 is lowered to VCC during the period between time t4 and time t5. Thereafter, the signal PRE1 and PRE2 are set at "H" level at time t5, resetting the bit lines BLi and BLi+1 at 0V. The bit lines BLi and BLi+1 remain at 0V until time t6. The word lines WL1 to WL4 are reset during the period between time t5 and time t6.

After the data-writing operation performed at time t1 to time t6 (FIG. 11), write verification is effected to detect whether or not the data has been written into the memory cell. How the write verification is carried out will be explained, with reference to the timing chart of FIG. 12. Here, assume that two of the bit lines BL1 to BL4223, i.e., bit lines BLi and BLi+1, are selected, that the word line WL2 is selected, that the signal CMOD is set at "L" to store two-value data.

At time t1, the signals BLC1 and BLC2 are set at "H" level, selecting the bit lines BLi and BLi+1. At time t2, the voltages VBL1 and VBL2 are set at VCC, whereby the bit lines BLi and BLi+1 are charged to "H" level during the period between time t2 and time t3. At time t3, the signals PRE1 and PRE2 are set at "L" level, disconnecting the bit lines BLi and BLi+1 from the voltage sources VBL1 and VBL2, respectively. Also at time t3, the select gate lines SG1 and SG2 of the selected block and the word lines WL1, WL3 and WL4 not selected are set at the power-supply voltage VCC. The word line WL2 is thereby set at 0.4V at time t3.

Figure 12:
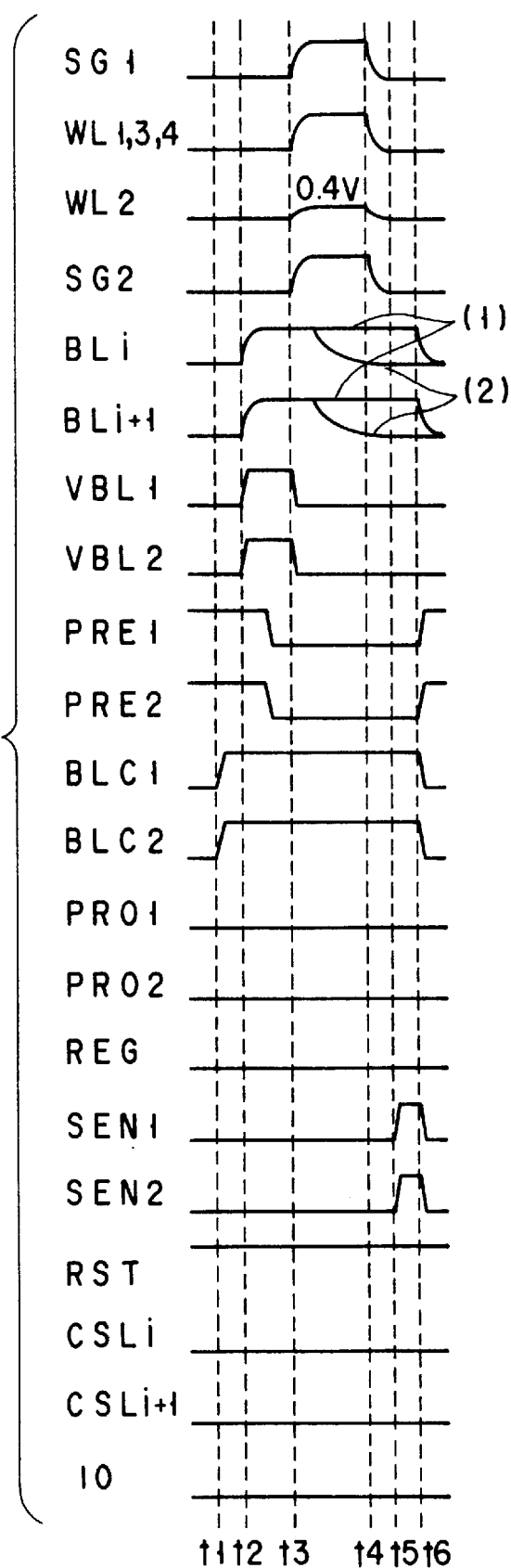
FIG. 12 is a timing chart for explaining how the write verification is effected in the memory device according to the first embodiment.

When the word line WL2 is set at 0.4V, the bit line BLi remains at "H" level as indicated at (1) in FIG. 12, if the memory M cell connected to the circuit 9 storing control data item "1" has assumed the state of storing data item "1". The bit line BLi is set at "L" level as shown at (2) in FIG. 12, if this memory cell has not taken yet the state of storing data item "1". The bit line BLi remains at "H" level as illustrated at (1) in FIG. 12, if the memory cell M connected to the circuit 9 storing control data item "0" has assumed the state of storing data item "1". The bit line BLi is set at "L" level as shown at (2) in FIG. 12, if this memory cell M has not assumed the state of storing data item "1".

At time t5, the signals SEN1 and SEN2 are set at "H" level, whereby the voltage on the bit line BL is read during the period between time t5 and time t6. Only when the memory cell M connected to the data-storing circuit 9 storing control data item "1" has taken the state of storing data item "1", the sub-data changes to "0." In any other case, the first sub-data remains unchanged.

When the write verification (WV) described is performed, the control data items stored in the data-storing circuit 9 is changed in accordance with the data-storing states of the memory cells, as is shown in the following Table 6:

TABLE 6

| Data-Storing State of Memory Cell | Sub-Data before WV | Sub-Data after WV |
|---|---|---|
| 0 or 1 | 0 | 0 |
| Not yet for 1 | 1 | 1 |
| 1 | 1 | 0 |

Data items are written into the memory cells by repeating the data-writing operation (t1 to t6, FIG. 11) and the write verification (FIG. 12) until all sub-data items (control data items) change to "0". The data-storing state of a memory cell M does not change if the cell M is connected to a circuit 9 which stores the initial control data item "0". The memory cell M assumes the value of storing data item "1" if it is connected to a circuit 9 storing the initial control data item "1". Whether all control data items are "0" can be determined by detecting whether or not the signal line PT (FIG. 6) is set at the ground potential. This is because the line PT is not set at the ground potential when all control data items are "0". The voltage on any word line WL selected to write data may be gradually increased.

A nonvolatile semiconductor memory device (EEPROM) according to the first aspect of the present invention, comprises a memory cell array 1 including a plurality of nonvolatile memory cells M, each capable of storing n-value data item where n≧3, a plurality of bit lines BL, a plurality of word lines WL, and a plurality of data-storing circuits 9, each connected to one bit line BL for storing a control data item which determines a write-control voltage to be applied to the bit line BL, thereby to write data items into the memory cells connected to the bit line BL. The memory device is characterized in that each data-storing circuit 9 supplies the write-control voltage and a read bit-line signal to the bit line BL in accordance with the control data item, detects a signal level of the read bit-line signal converted in response to the data-storing state of the memory cell M, and changes the control data item on the basis of the data-storing state of the memory cell M.

The following are preferred embodiments of the memory device according to the first aspect of the present invention.
(1) Each of the data-storing circuits 9 comprises a sub-data circuit 20 (Qp1, Qp2, Qn1, Qn2, Qn3, Qn4 and Qn6) and a sub-data circuit 21 (Qp4, Qp5, Qn10, Qn11, Qn12, Qn13, Qn15 and Qn16), each for storing sub-data item of a first signal level or a second signal level. Each of the sub-data circuits 20 and 21 changes the sub-data item of the first signal level, which is stored, to sub-data item of the second signal level, in response to a prescribed signal level of the read bit-line signal, and holds the sub-data item of the second signal level.
(2) Each of the memory cells M can store four-value data item, and each of the data-storing circuits includes two sub-data circuits 20 and 21.
(3) Each of the memory cells M can store three-value data item, and each of the data-storing circuits includes two sub-data circuits 20 and 21.

A nonvolatile semiconductor memory device (EEPROM) according to the second aspect of the invention, comprises a memory cell array 1 including a plurality of nonvolatile memory cells M, each assuming one of data-writing states corresponding to n data-storing levels where n≧3, a plurality of bit lines BL, a plurality of word lines WL, and a plurality of data-storing circuits 9, each connected to one bit line BL for storing one of n control data items of n logic levels where n≧3, which determines a write-control voltage to be applied to the bit line BL, thereby to write data items into the memory cells connected to the bit line BL. The memory device is characterized in some respects. First, each data-storing circuit 9 supplies the write-control voltage to the bit line BL in accordance with the control data item. Second, each data-storing circuit 9 supplies a read bit-line signal to the bit line BL when the control data item is at the i-th logic level or the first logic level, thereby to detect whether the data-writing state of the memory cell M connected to the data-storing circuit 9 which stores a control data item at the i-th logic level (i=2 to n) is identified by the i-th data-storing level which corresponds to the i-th logic level. Third, each data-storing circuit 9 detects a signal level of the read bit-line signal converted in response to the data-storing state of the memory cell M, and changes the control data item on the basis of the data-storing state of the memory cell M.

The following are preferred embodiments of the memory device according to the second aspect of the present invention.
(1) Each of the data-storing circuits 9 comprises a sub-data circuit 20 (Qp1, Qp2, Qn1, Qn2, Qn3, Qn4 and Qn6) and a sub-data circuit 21 (Qp4, Qp5, Qn10, Qn11, Qn12, Qn13, Qn15 and Qn16), each for storing sub-data item of a first signal level or a second signal level. Each of the sub-data circuits 20 and 21 changes the sub-data item of the first signal level, which is stored, to sub-data item of the second signal level, in response to a prescribed signal level of the read bit-line signal, and holds the sub-data item of the second signal level.
(2) Each of the memory cells M can store four-value data item, and each of the data-storing circuits includes two sub-data circuits 20 and 21.
(3) Each of the memory cells M can store three-value data item, and each of the data-storing circuits includes two sub-data circuits 20 and 21.

A nonvolatile semiconductor memory device (EEPROM) according to the third aspect of the invention, comprises a memory cell array 1 including a plurality of nonvolatile memory cells M, a plurality of bit lines BL, a plurality of word lines WL, switching means 7 capable of assuming a first state to set four data-writing states for each memory cell M and a second state to set two data-writing states for each memory cell M, and a plurality of sub-data circuits (Qp1, Qp2, Qn1, Qn2, Qn3, Qn4 and Qn6) and (Qp4, Qp5, Qn10, Qn11, Qn12, Qn13, Qn15 and Qn16), each for storing a sub-data item. The memory device is characterized in two respects. First, while the switching means 7 remains in the first state, each pair of the sub-data circuits 20 and 21 operates as a single data-storing circuit 9, and the data-storing circuit 9 is electrically connected to one bit line BL and stores a control data item defined by two sub-data items. The control data item determines a write-control voltage which is to be applied to its respective bit line BL in order to set one of the four data-writing states into the memory cells M connected to the bit line BL. Second, while the switching means 7 remains in the second state, each sub-data circuit 20 or 21 operates as a single data-storing circuits 9, and each data-storing circuit 9 is electrically connected to one bit line BL and stores a control data item defined by one sub-data item. The control data item determines a write-control voltage which is to be applied to its respective bit line BL in order to set one of the two data writing states into the memory cells M connected to the bit line BL.

The following is a preferred embodiment of the memory device according to the third aspect of the invention.

Each of the sub-data circuits 20 and 21 stores a sub-data item of a first signal level or a second signal level and changes the sub-data item of the first signal level, which is stored, to a sub-data item of the second signal level, in response to a prescribed level of a bit-line signal, and holds the sub-data item of the second signal level.

A nonvolatile semiconductor memory device (EEPROM) according to the fourth aspect of the invention, comprises a memory cell array 1 including a plurality of nonvolatile memory cells M, a plurality of bit lines BL, and a plurality of word lines WL, switching means 7 capable of assuming a first state to set three data-writing states for each memory cell M and a second state to set two data-writing states for each memory cell M, a plurality of sub-data circuits (Qp1, Qp2, Qn1, Qn2, Qn3, Qn4 and Qn6) and (Qp4, Qp5, Qn10, Qn11, Qn12, Qn13, Qn15 and Qn16), each for storing a sub-data item. The memory device is characterized in that while the switching means 7 remains in the first state, each pair of the sub-data circuits 20 and 21 operates as a single data-storing circuit 9, and each data-storing circuit 9 is electrically connected one bit line BL and stores a control data item defined by two sub-data item. The control data item determines a write-control voltage which is to be applied to the bit line BL in order to set one of the three data-writing states into the memory cells M connected to the bit line BL. Second, while the switching means 7 remains in the second state, each of the sub-data circuits 20 and 21 operates as a single data-storing circuit 9, and each data-storing circuit 9 is electrically connected one bit line BL and stores a control data item defined by one sub-data item. The control data item determines a write-control voltage which is to be applied to its respective bit line BL in order to set one of the two data writing states into the memory cells M connected to the bit line BL.

The following is a preferred embodiment of the memory device according to the fourth aspect of the invention.

Each of the sub-data circuits 20 and 21 stores a sub-data item of a first signal level or a second signal level and changes the sub-data item of the first signal level, which is stored, to a sub-data item of the second signal level, in response to a prescribed level of a bit-line signal, and holds the sub-data item of the second signal level.

A nonvolatile semiconductor memory device (EEPROM) according the fifth aspect of the invention, comprises a memory cell array 1 including a plurality of non-volatile memory cells M, each capable of storing n-value data item where n≧3, a plurality of bit lines BL, a plurality of word lines WL, and a plurality of data-storing circuits 9, each connected to one bit line BL. The memory device is characterized in that each data-storing circuit 9 stores a data item and supplies a read bit-line signal to the bit line BL in accordance with the data item, detects a signal level of the read bit-line signal converted in response to the data item stored in the memory cell connected to the bit line, and stores the signal level of the read bit-line signal thus detected.

The following are preferred embodiments of the memory device according to the fifth aspect of the present invention.

(1) Each of the data-storing circuits 9 comprises a sub-data circuit 20 (Qp1, Qp2, Qn1, Qn2, Qn3, Qn4 and Qn6) and a sub-data circuit 21 (Qp4, Qp5, Qn10, Qn11, Qn12, Qn13, Qn15 and Qn16), each for storing sub-data of a first signal level or a second signal level. Each of the sub-data circuits 20 and 21 changes the sub-data of the first signal level, which is stored, to sub-data of the second signal level, in response to a prescribed signal level of the read bit-line signal, and holds the sub-data of the second signal level.

(2) Each of the memory cells M can store four-value data item, and each of the data-storing circuits includes two sub-data circuits 20 and 21.

(3) Each of the memory cells M can store three-value data item, and each of the data-storing circuits includes two sub-data circuits 20 and 21.

As described above, the EEPROM which is the first embodiment of the invention can store n-value data where n≧3. In this EEPROM a read signal is supplied to selected memory cells in accordance with the control data item stored in each data-storing circuit. The control data item stored in one data-storing circuit can therefore be changed easily, and the structure of the EEPROM can be more simple than otherwise. Since a read signal is supplied to selected memory cells, data can be easily read from the selected memory cells. This also helps to simplify the structure of the EEPROM, making it possible to provide an inexpensive EEPROM.

Each of the data-storing circuits for storing control data items may be used to write four-value data items into the memory cells. Each data-storing circuit may be divided into two units. Then, each unit can store control data items used to write two-value data items into the memory cell. If so, the data-storing circuits incorporated in the EEPROM do not become redundant. Thus, the EEPROM is less expensive than otherwise.

Alternatively, each data-storing circuit may be used to write three-value data items into the memory cells, and may be divided into two units. Thus, each unit can store control data items used to write two-value data items into the memory cell. In this case, too, the data-storing circuits incorporated in the EEPROM do not become redundant, and the EEPROM is less expensive than otherwise.

Figure 13:
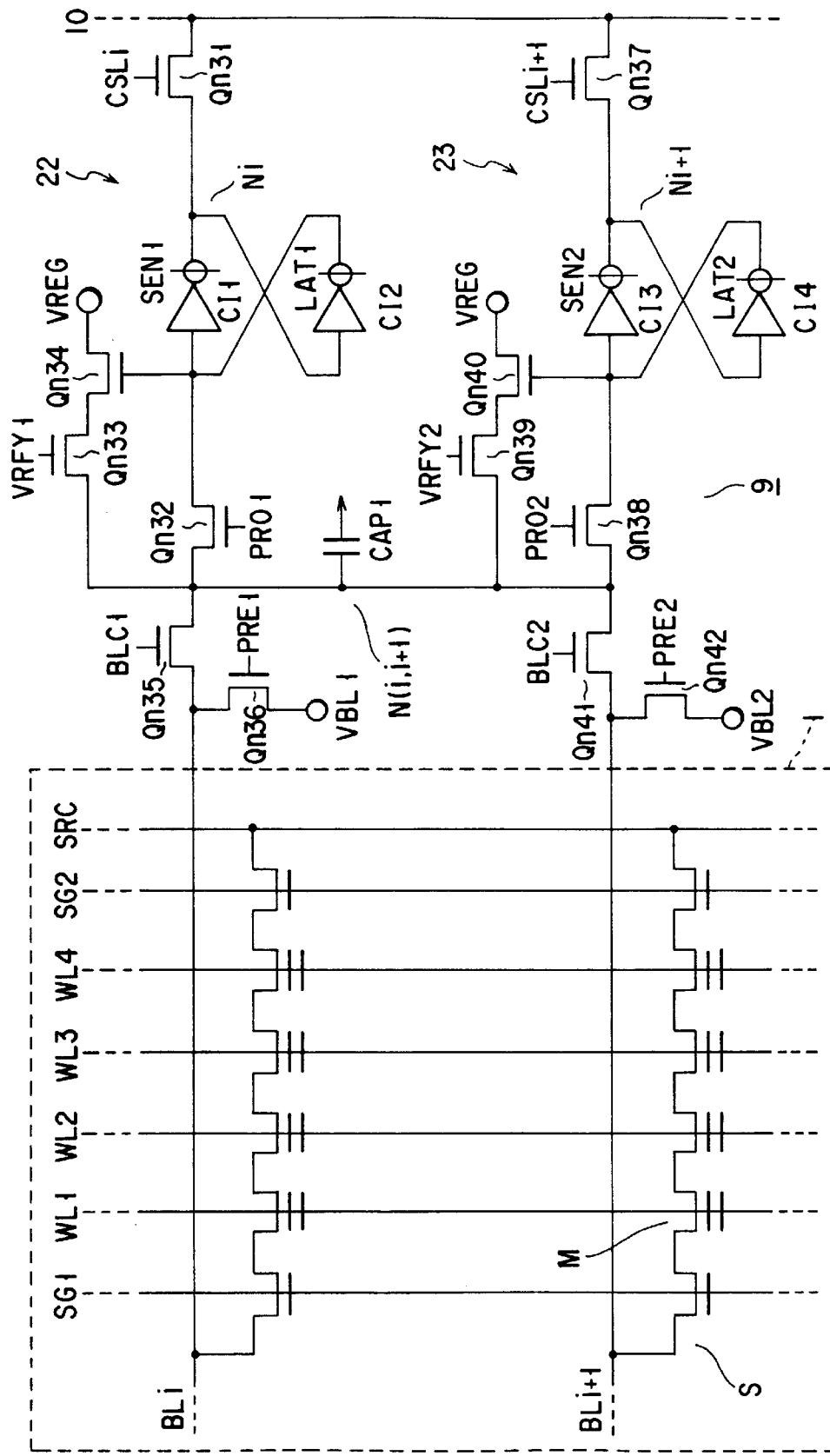
FIG. 13 is a circuit diagram showing the memory cell array and one of the identical data-storing circuits, which are incorporated in a nonvolatile semiconductor memory device according to a second embodiment of the invention.

FIG. 13 shows the memory cell array 1 and one of the identical data-storing circuits 9, which are incorporated in a nonvolatile semiconductor memory (EEPROM) which is a second embodiment of the present invention. The EEPROM is designed to store four-value data, like the EEPROM according to the first embodiment.

As shown in FIG. 13, the data-storing circuit 9 comprises a first sub-data circuit 22 and a second sub-data circuit 23. The circuits 22 and 23 perform the same function as the sub-data circuits 20 and 21 used in the first embodiment. Each of the circuits 22 and 23 is connected to one bit line BL (BLi or BLi+1). In order to write data items into the memory cells M connected to the bit line, each sub-data circuit stores a sub-data item "0" or "1", changes a sub-data item "1" stored when the node N(i,i+1) is set at "H" level, to a sub-data item "0", and holds the sub-data item "0" thus obtained. To read data items from the memory cells M connected to the bit line BL, the first sub-data circuit 22 stores a sub-data item "1" or "0", changes a sub-data item "1" stored when the node N(i,i+1) is set at "H" level, to a read sub-data item "0", and holds the read sub-data item "0".

The first sub-data circuit 22 is constituted by clocked inverters CI1 and CI2 and n-channel MOS transistors Qn32, Qn33 and Qn34. The second sub-data circuit 23 is constituted by clocked inverters CI3 and CI4 and n-channel MOS transistors Qn38, Qn39 and Qn40. While the node N(i,i+1)

remains at "H" level, the circuit 22 stores a first sub-data item "1" to be read. While the node N(i,i+1) remains at "H" level, the circuit 23 stores a second sub-data item "1" to be read. While the node N(i,i+1) remains at "L" level, the first sub-data circuit 22 stores a first sub-data item "0" to be read, and the second sub-data circuit 23 stores a first sub-data item "0" to be read.

The n-channel MOS transistors Qn31 and Qn37 are provided to electrically connect the sub-data circuits 22 and 23, respectively, to the input/output line IO. The gate electrode of the n-channel MOS transistor Qn31 receives an output signal CSLi output from the column decoder 3 shown in FIG. 1. The gate electrode of the n-channel MOS transistor Qn37 receives an output signal CSLi+1 output from the column decoder 3. When the signal CSLi changes to "H" level, the first sub-data circuit 22, which is incorporated in the data-storing circuit 9 connected to the bit lines BLi and BLi+1, is electrically connected to the input/output line IO. The data input/output line IO is connected to a data input/output buffer 4 shown in FIG. 1. The sub-data to be read out can be thereby output to the data input/ output buffer 4. The data input/output line IO is provided to input data to, and output data from, all data-storing circuits 9 shown in FIG. 2.

The n-channel MOS transistor Qn35 controls the electrical connection of the first sub-data circuit 22 to the bit line BLi. The n-channel MOS transistor Qn41 controls the electric connection of the second sub-data circuit 23 to the bit line BLi+1. Signals BLC1 and BLC2 are supplied to the MOS transistors Qn35 and Qn41, respectively. While the signals BLC1 and BLC2 remain at "H" level and "L" level, respectively, both sub-data circuits 22 and 23 are electrically connected to the bit line BLi. On the other hand, while the signals BLC1 and BLC2 remain at "L" level and "H" level, respectively, both sub-data circuits 22 and 23 are electrically connected to the bit line BLi+1.

The n-channel MOS transistor Qn36 controls the electrical connection of the bit line BLi to a voltage source VBL1. The n-channel MOS transistor Qn42 controls the electrical connection of the bit line BLi+1 to a voltage source VBL2. Signals PRE1 and PRE2 are supplied to the MOS transistors Qn36 and Qn42, respectively. While the signal PRE1 remains at "H" level, the bit line BLi is electrically connected to the voltage source VBL1. Similarly, while the signal PRE2 remains at "H" level, the bit line BLi+1 is electrically connected to the voltage source VBL2.

The node N(i,i+1) is provided on a data transfer line 24 and connected to one electrode of a capacitor CAP1. A signal indicating the data-writing state of the memory cells M connected to the bit line BLi is supplied to the node N(i,Ni+1) through the bit line BLi. Similarly, a signal indicating the data-writing state of the memory cells M connected to the bit line BLi+1 is supplied to the node N(i,i+1) through the bit line BLi+1. In the first sub-data circuit 22, the clocked inverter CI1 detects the logic level of the signal supplied to the node N(i,i+1). In the second sub-data circuit 23, the clocked inverter CI2 detects the logic level of the signal supplied to the node N(i,i+1). In other words, the inverters CI1 and CI2 detect the absolute value of the voltages applied to the node N(i,Ci+1). The clocked inverters CI1 and CI3 may be replaced by two differential sense amplifiers. If this is the case, one differential sense amplifier detects, as a logic level, the difference between a reference voltage and the absolute value of the voltage applied to the node N(i,i+1), and the other differential sense amplifier detects, as a logic level, the difference between the reference voltage and the absolute value of the voltage applied to the node N(i,i+1). The other electrode of the capacitor CAP1 is connected to the ground. The capacitor CAP1 may be a capacitance between two wiring layers or between a wiring layer and the semiconductor substrate. Alternatively, the capacitor CAP1 may be an n-channel MOS transistor having a sufficiently low threshold voltage whose gate is connected to the node N(i,i+1) and whose source and drain are connected to the ground.

The clocked inverters CI1 and CI2 have the same structure illustrated in FIGS. 14A and 14B. FIG. 14A is a symbol diagram, and FIG. 14B is a circuit diagram. As shown in FIG. 14B, each clocked inverter CI comprises two n-channel MOS transistors Qn43 ad Qn44 and two p-channel MOS transistors Qp11 and Qp12. The n-channel MOS transistor Qn43 and the p-channel MOS transistor Qp12 constitute an inverter circuit. A signal is supplied to the input signal terminal IN of the inverter circuit. The inverter circuit inverts the signal. The signal inverted is supplied from the output terminal OUT of the inverter circuit. The n-channel MOS transistor Qn44 and the p-channel MOS transistor Qp11 cooperate to activate or deactivate the inverter circuit in accordance with a signal CLOCK and a signal CLOCKB generated by inverting the signal CLOCK. When the signals CLOCK and CLOCKB are at "H" level and "L" level, respectively, the inverter CI is activated. When the signals CLOCK and CLOCKB are at "L" level and "H" level, respectively, the inverter CI is deactivated.

Signals SEN1, SEN2, LAT1, LAT2, PRO1, PRO2, BLC1, BLC2, PRE1, PRE2, VRFY1 and VRFY2 and voltages VBL1, VBL2 and VREG are generated by the control signal/ voltage generating circuit 7 shown in FIG. 1. These signals and voltages are supplied and applied to all data-storing circuits 9 shown in FIG. 2. The power-supply voltage VCC is, for example, 3.3V.

In the first sub-data circuit 22 (FIG. 13), the n-channel MOS transistors Qn33 and Qn34 adjust the voltage at the node N(i,i+1) before the signal PROL rises to "H" level and the clocked inverter CI1 detects the voltage at the node N(i,i+1). The voltage at the node N(i,i+1) is at "H" level while the first sub-data remain "0". When the signal PRO1 rises to "H", level, the voltage at "H" level is applied from the node N(i,i+1) to the input terminal of the inverter CI1. The node N(i,i+1) is thereby set at "L" level. The clocked inverter CI2 stores a first sub-data item "0". Hence, the first sub-data item stored in the first sub-data circuit 22 remains "0". If the sub-data item stored in the circuit 22 is "1", it is changed to a sub-data item "0" when the node N(i,i+1) is set at "H" level and remains unchanged when the node N(i,i+1) is set at "L" level.

In the second sub-data circuit 23 (FIG. 13), the n-channel MOS transistors Qn39 and Qn40 adjust the voltage at the node N(i,i+1) before the signal PRO2 rises to "H" level and the clocked inverter CI3 detects the voltage at the node N(i,i+1). The voltage at the node N(i,i+1) is at "H" level while the second sub-data remain "0". When the signal PRO2 rises to "H" level, the voltage at "H", level is applied from the node N(i,i+1) to the input terminal of the inverter CI1. The node N(i,i+1) is thereby set at "L" level. The clocked inverter CI4 stores a first sub-data item "0". Hence, the second sub-data item stored in the second sub-data circuit 23 remains "0". If the sub-data item stored in the circuit 22 is "1", it is changed to a sub-data item "0" when the node N(i,i+1) is set at "H" level and remains unchanged when the node N(i,i+1) is set at "L" level.

The first sub-data circuit 22 and the second sub-data circuit 23 may be replaced by various circuits which are designed to perform the same function as the circuits 22 and 23.

FIG. 15 illustrates the circuit peripheral to the data-storing circuit 9 which is shown in FIG. 13. The peripheral circuit comprises n-channel MOS transistors Qn45 to Qn48 and a signal line PT. The gate electrode of the MOS transistor Qn45 is connected to the node N(i,i+1). Also connected to the node N(i,i+1) is one end of the current path of the MOS transistor Qn47. The gate electrode of the MOS transistor Qn46 is connected to the node Ni+1 the second sub-data circuit 23. Connected to the node Ni+1 is one end of the current path of the MOS transistor Qn48. The n-channel MOS transistors Qn45 and Qn46 constitute a circuit for detecting whether or not all sub-data circuits store sub-data items "0". If all sub-data circuits store sub-data items "0", the signal line PT is not set at the ground potential. If any one of the sub-data circuits stores sub-data "1", the signal line PT is set at the ground potential. The n-channel MOS transistors Qn47 and Qn48 constitute a circuit for storing sub-data "0" into all sub-data circuits. Sub-data "0" is stored into 4,224 sub-data circuits when a signal PRST rises to "H" level.

Figure 16:
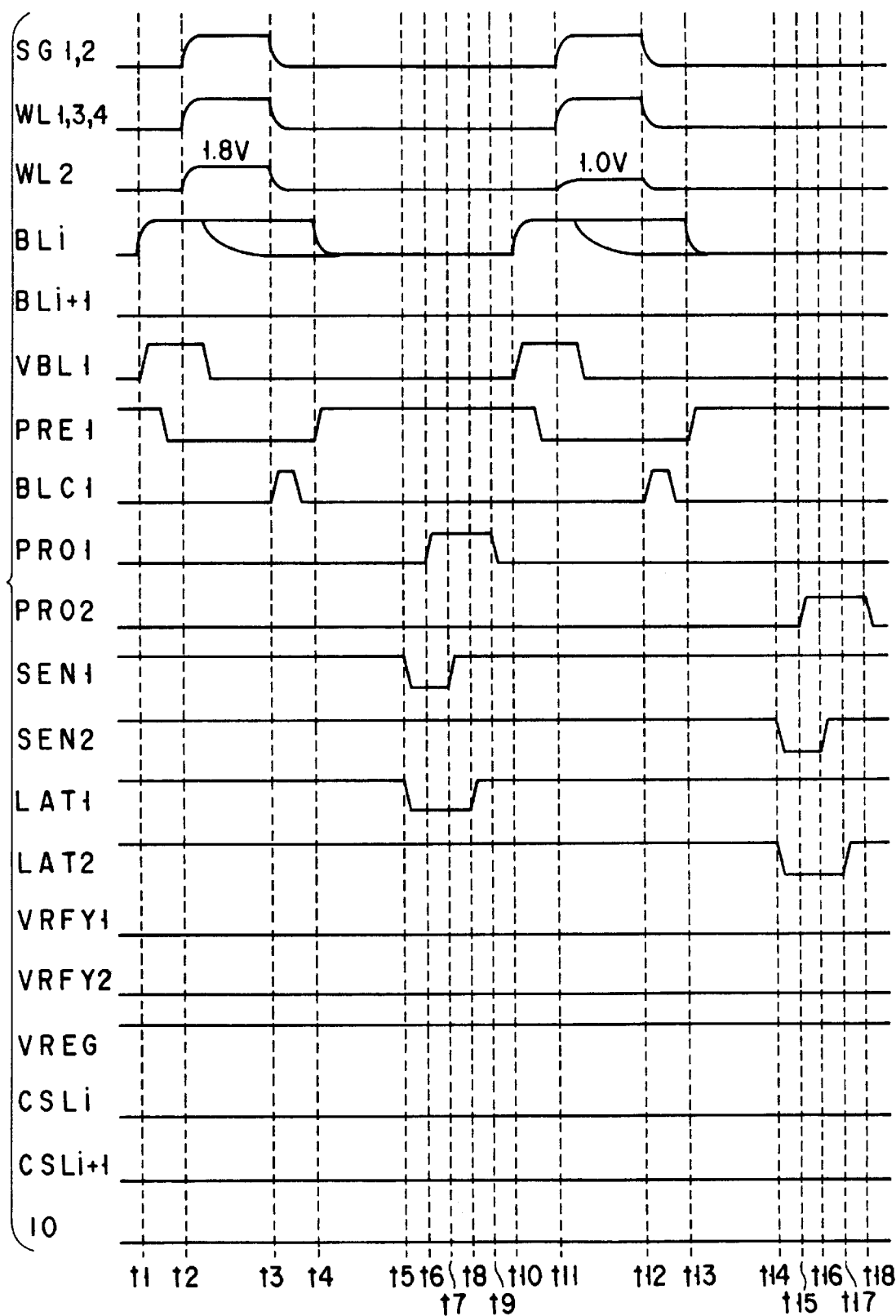
FIG. 16 is a timing chart for explaining a first method of reading four-value data from the memory cells of the device according to the second embodiment of the invention.

How four-value data is read from the memory cells of the EEPROM will be explained, with reference to the timing charts of FIGS. 16 and 17. Let us assume that one of the bit lines BL0 to BL4222, i.e., bit line BLi, is selected, that the word line WL2 is selected, that the signal CMOD is set at "H" level to read four-value data. If three data-storing levels are provided, three-value data can be read from the memory cells of the EEPROM. Since the voltage VBL2, the signal BLC2 and the signal PRE2 remain at 0V, "L" level and "H" level, they are not shown in FIG. 16 or FIG. 17.

First, at time t1, the voltage VBL1 is set at VCC, whereby the bit line BLi is charged to "H" level. At time t2, the signal PRE1 is set at "L" level, dis-connecting the bit line BLi from the voltage source VBL1. Also at time t2, the select gate lines SG1 and SG2 of the selected block and the word lines WL1, WL3 and WL4 not selected are set at the power-supply voltage VCC. The word line WL2 is thereby set at 1.8V at time t2.

Table 7 below shows the relationship between the four data items each memory cell M can store and the threshold voltages the memory cell has to store the four data items, respectively.

TABLE 7

| Data Item | Threshold Voltage |
| --- | --- |
| 0 | 0 V or less |
| 1 | 0.4 V–0.8 V |
| 2 | 1.2 V–1.6 V |
| 3 | 2.0 V–2.4 V |

When the potential of the word line WL2 increases to 1.8V, the bit line BLi remains at "H" level if the memory cell M stores data item "3". If the memory cell M stores any other data item (i.e., "0", "1" or "2"), the bit line BLi will be set at "L" level. Then, at time t3, the signal BLC1 is set at "H" level, whereby the voltage on the bit line BLi is applied to the node N(i,i+1). When the signal BLC1 falls to "L" level, the signal PRE1 rises to "H" level at time t4, whereby the bit line BLi is reset at voltage VBL1 of 0V. At time t5, the signals SEN1 and LAT1 are set at "L" level, deactivating both clocked inverters CI1 and CI2. The signal PRO1 rises to "H" level at time t6, and so does the signal SEN1 at time t7. The clocked inverter CI1 is thereby activated, detecting the voltage at the node N(i,i+1). At time t8, the signal LAT1 is set at "H" level, activating the clocked inverter CI2. The inverter CI2 detects the voltage at the node N(i,i+1). As a result, the logic level of the signal at the node N(i,i+1) is latched. At time t9, the signal PRO1 rises to "H" level, whereby it is determined whether the memory cell M has a threshold voltage of 1.8V or more. The first sub-data to read from the first sub-data circuit 22 is "0" only when the memory cell M stores a data item "3". When the cell M stores any other data item, "0", "1" or "2", the first sub-data is "1".

Then it is detected whether or not the memory cell M has a threshold voltage of 1.0V or more. At time t10, the voltage VBL1 is set at VCC, charging the bit line BLi to "H" level. At time t11, the signal PRE1 is set at "L" level, disconnecting the bit line BLi from the voltage source VBL1. The select gate lines SG1 and SG2 of the selected block and the word lines WL1, WL3 and WL4 not selected are thereby set at the power-supply voltage VCC, and the word line WL2 is therefore set at 1.0V.

When the word line WL2 is set at 1.0V, the bit line BLi remains at "H" level only if the data item stored in the memory cell M is either "3" or "2". In any other case, the bit line BLi is set at "L" level. Thereafter, at time t12, the signal BLC1 is set at "H" level, applying the voltage applied on the bit line BLi to the node N(i,i+1). When the signal BLC1 falls to "L" level, the signal PREI rises to "H" level at time t13. The bit line BLi is thereby reset at 0V, i.e., the voltage VBL1. At time t14, the signals SEN2 and LAT 2 are set at "L" level, deactivating both clocked inverters CI3 and CI4. The signal PRO2 rises to "H" level at time t15, and so does the signal SEN2 at time t16. The clocked inverter CI3 is thereby activated, detecting the voltage at the node N(i,i+1). At time t17, the signal LAT2 is set at "H" level, activating the clocked inverter CI4. The inverter CI4 detects the voltage at the node N(i,i+1). As a result, the logic level of the signal at the node N(i,i+1) is latched. At time t18, the signal PRO2 falls to "L" level, whereby it is determined whether the memory cell M has a threshold voltage of 1.0V or more. The second sub-data to read from the second sub-data circuit 23 is "0" only when the memory cell M stores a data item "3" or "2". When the cell M stores a data item, "0" or "1", the second sub-data is "1".

Next, it is detected whether or not the memory cell M has a threshold voltage of 0.0V or more. At time t19, the voltage VBL1 is set at VCC, charging the bit line BLi to "H" level. At time t20, the signal PRE1 is set at "L" level, disconnecting the bit line BLi from the voltage source VBL1. The select gate lines SG1 and SG2 of the selected block and the word lines WL1, WL3 and WL4 not selected are thereby set at the power-supply voltage VCC, and the word line WL2 is therefore set at 0.0V.

When the word line WL2 is set at 0.0V, the bit line BLi remains at "H" level only if the data item stored in the memory cell M is "3", "2" or "1". If the data item stored in the cell M is "0", the bit line BLi is set at "L" level. Then, at time t21, the signal BLC1 is set at "H" level, applying the voltage applied on the bit line BLi to the node N(i,i+1). When the signal BLC1 falls to "L" level, the signal PRE1 rises to "H" level at time t22. The bit line BLi is thereby reset at 0V, i.e., the voltage VBL1. At the same time, the voltage VREG is changed to 0V, and the signal VRFY2 is set at "H" level. The node N(i,i+1) is set at "L" level only if the second sub-data to be read from the second sub-data circuit 23 is "0". At time t23, the voltage VREG and the signal VRFY1 are set at VCC and "H" level, respectively. The node N(i,i+1) is set at "H" level only if the first sub-data is "0". At time t4, the signals SEN1 and LAT1 are set at "L" level, deactivating both clocked inverters CI1 and CI2. The signal PRO1 rises to "H" level at time t25, and so does the signal SEN1 at time t26. The clocked inverter CI1 is thereby activated, detecting the voltage at the node N(i,i+1). At time t27, the signal LAT1 is set at "H" level, activating the clocked inverter CI2. The inverter CI2 detects the voltage at the node N(i,i+1). As a result, the logic level of the signal at the node N(i,i+1) is latched. At time t28, the signal PRO1 falls to "L" level, whereby it is determined whether the memory cell M has a threshold voltage of 0.0V or more. The second sub-data to be read from the first sub-data circuit 22 is "0" only when the memory cell M stores a data item "3" or "1". When the cell M stores a data item "0" or "2", the first sub-data is "1".

When the signal CSLi is set at "H" level, the first sub-data is output to the external device through the data input/output line IO, the data input/output buffer 4 and to the input/output terminal 5. When the signal CSLi+1 is set at "H" level, the second sub-data is output to the external device through the data input/output line IO, the data input/output buffer 4 and to the input/output terminal 5.

While data is being read from the memory cell M, the bit line BLi+1 not selected is fixed at the voltage VBL2, e.g., 0V.

Table 8 presented below shows the relationship between the four data items each memory cell M can store, the values the first sub-data can have and the values the second sub-data can have.

TABLE 8

| Data in Cell | First Sub-Data | Second Sub-Data |
|---|---|---|
| 0 | 1 | 1 |
| 1 | 0 | 1 |
| 2 | 1 | 0 |
| 3 | 0 | 0 |

Figure 18:
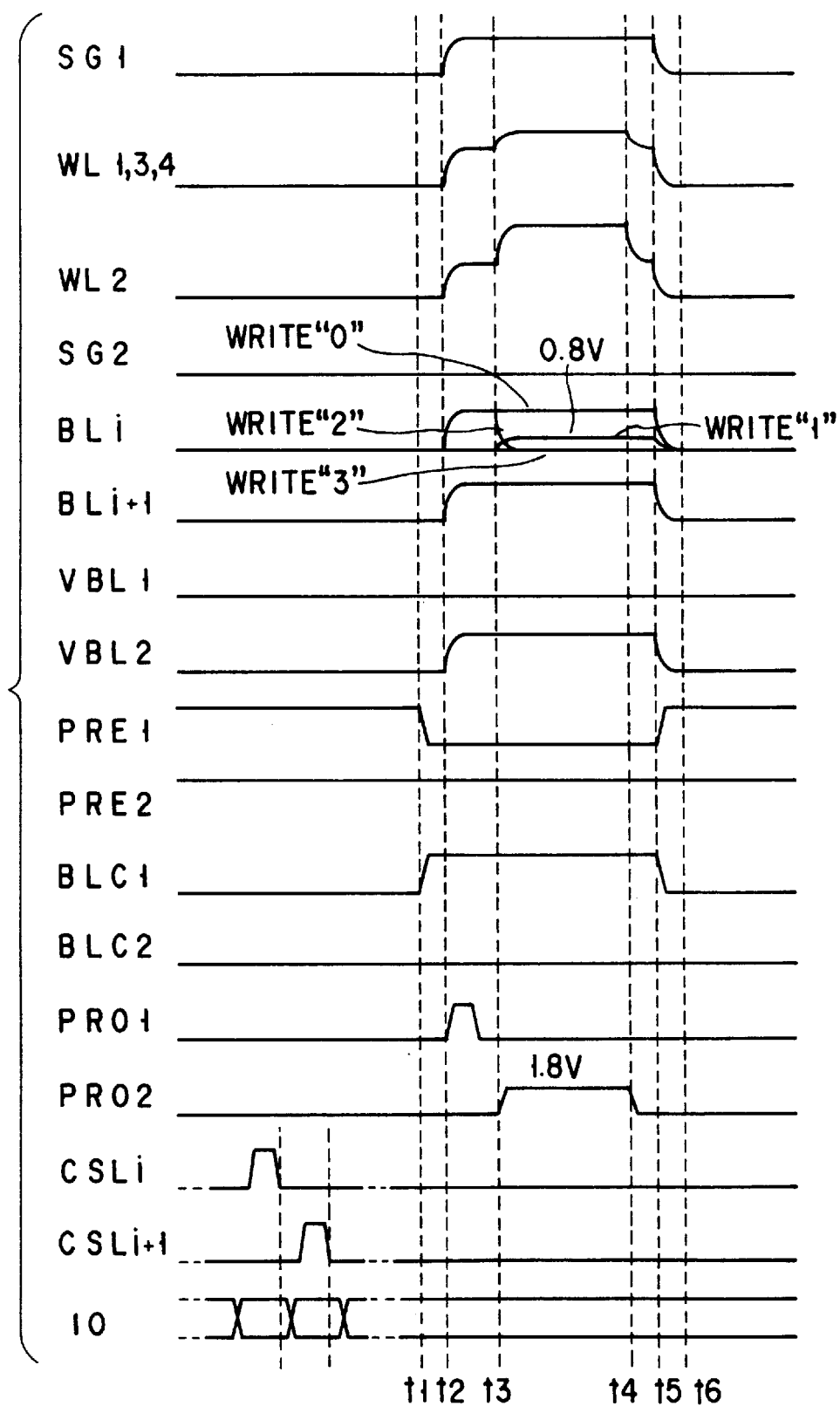
FIG. 18 is a timing chart for explaining how initial sub-data is set in each sub-data circuit and how data is written into memory cells in the memory device according to the second embodiment.

How initial control data is set in, and data is written into, each data-storing circuit 9 will be explained, with reference to the timing chart of FIG. 18. Let us assume that one of the bit lines BL1 to BL4222, i.e., bit line BLi, is selected, and that the word line WL2 is selected, that the signal CMOD is set at "H" level to read four-value data. If three data-storing levels are provided, three-value data can be read from the memory cells of the EEPROM.

Initial control data is set in the data-storing circuit 9 connected to the bit line BLi selected, in the following way. First, the initial sub-data item to be set in the first sub-data circuit 22 is transferred to the data input/output line IO. The signal CSLi is set at "H" level, whereby the initial sub-data item is stored into the first sub-data circuit 22. Then, the initial sub-data item to be set in the second sub-data circuit 23 is transferred to the data input/output line IO. The signal CSLi+1 is set at "H" level, whereby the initial sub-data item is stored into the second sub-data circuit 23. The initial control data and the initial sub-data items set in the sub-data circuits 22 and 23 have the relationship shown in Table 9.

TABLE 9

| Initial Control Data | Initial Sub-Data in Circuit 22 | Initial Sub-Data in Circuit 23 |
|---|---|---|
| 0 | 0 | 0 |
| 1 | 1 | 0 |
| 2 | 0 | 1 |
| 3 | 1 | 1 |

It is desired that the signal PRST be set at "H" level, thereby to reset the sub-data items to "0" before the initial sub-data items are set in the circuits 22 and 23. As will be described later, the sub-data items "0" do not alter the state of the memory cells M. Hence, it suffices to supply initial sub-data items to the EEPROM from the external device and set them into only desired ones of the 2112 data-storing circuits 9 provided in the EEPROM. Instead, initial sub-data items may of course be set in all 2112 data-storing circuits 9 from the external device. Since the signals SEN1, LAT1, VRFY1, SEN2, LAT2 and VRFY2 and the voltage VREG remain at "H" level, "H" level, "L" level, "H" level, "H" level, "L" level and VCC, respectively, they are not shown in FIG. 18.

To write data items into the memory cells M, the signal PRE1 is set at "L" level at time t1, thereby disconnecting the bit line BLi from the voltage source VBL1. Also at time t1, the signal BLC1 is set at "H" level, thus selecting the bit line BLi. At time t2, the voltage VBL2 is set at VCC, whereby the bit line BLi+1 not selected is charged until time t3 by means of the n-channel MOS transistor Qn32. At the same time, the signal PRO1 is set at "H" level, whereby the bit line BLi is charged until time t3 in accordance with the first sub-data. More precisely, the bit line BLi is charged to VCC if the first sub-data is "0" or "2". If the first sub-data is "1" or "3", the bit line BLi is charged to 0V. The select gate SG1 and the word lines WL1 to WL4 are set at VCC during the period between t2 and time t3. The select gate line SG2 remains at 0V during this period. At time t3, the signal PRO2 is set at 1.8V, whereby the voltage on the bit line BLi is changed in accordance with the second sub-data. If the second sub-data is "0", the bit line BLi is charged from 0V to 0.8V which is lower than 1.8V by the threshold voltage (e.g., 1V) of the n-channel MOS transistor Qn38. If the bit line BLi is set at VCC at time t3, it remains at VCC when second sub-data is "0". If the second sub-data is "1", the n-channel MOS transistor Qn38 is off, and the bit line BLi is set at 0V.

Thus, the bit line BLi is set at VCC when the control data is "0", at 0.8V when the control data is "1", and at 0V when the control data is "2" or "3".

At time t3, the word line WL2 selected is set at 20V, whereas the word lines not selected, WL1, WL3 and WL4, are set at 10V. The word lines WL1 to WL4 remain at these voltages until time t4. During the period between time t3 and time t4, electrons are injected into the floating gates of the memory cells, in numbers which accord with the control data. If the bit line BL is set at 0V, the potential difference between the word line WL and the channel of the memory cell M is 20V, and electrons are injected to the floating gate of any cell M connected to the bit line BL. If the bit line BL is set at 0.8V, the potential difference between the word line WL and the channel of the memory cell M is 19.2V, and electrons are injected to the floating gate of any cell M, but in smaller numbers than when the potential difference is 20V. If the bit line BL is set at VCC, the potential difference is so small that virtually no electrons are injected into the floating gate of the memory cell M. The voltage on the word lines WL1 to WL4 is lowered to VCC during the period between time t4 and time t5. Thereafter, the voltage VBL2 is set at 0V and the signal PRE1 is set at "H" level at time t5, resetting the bit lines BLi and BLi+1 at 0V. The bit lines BLi and BLi+1 remain at 0V until time t6, and the voltage VBL1 remains at 0V. The word lines WL1 to WL4 are reset during the period between time t5 and time t6.

Figure 19:
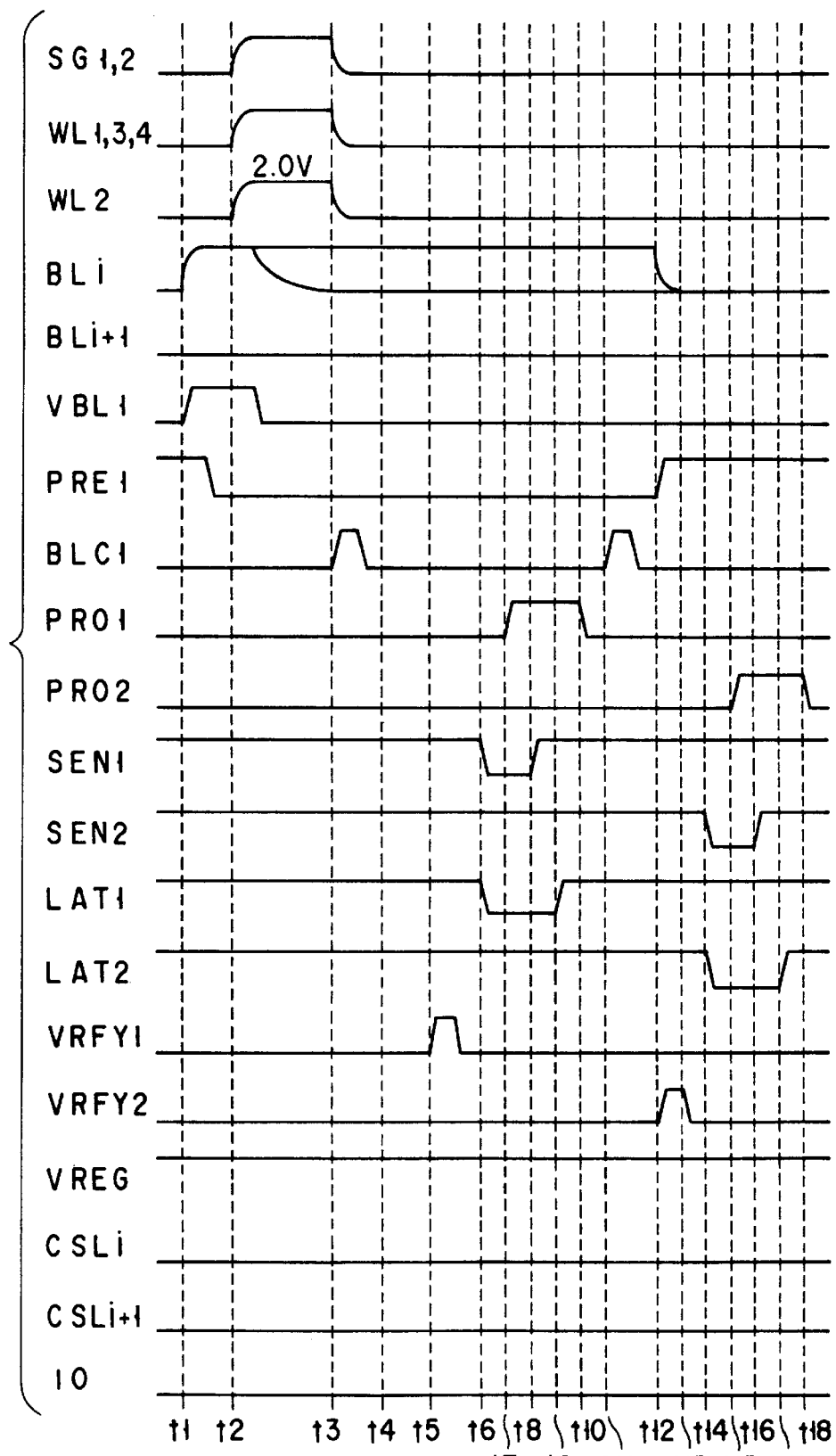
FIG. 19 is a timing chart for explaining how a first method of performing write verification is effected in one mode in the memory device according to the second embodiment.
Figure 20:
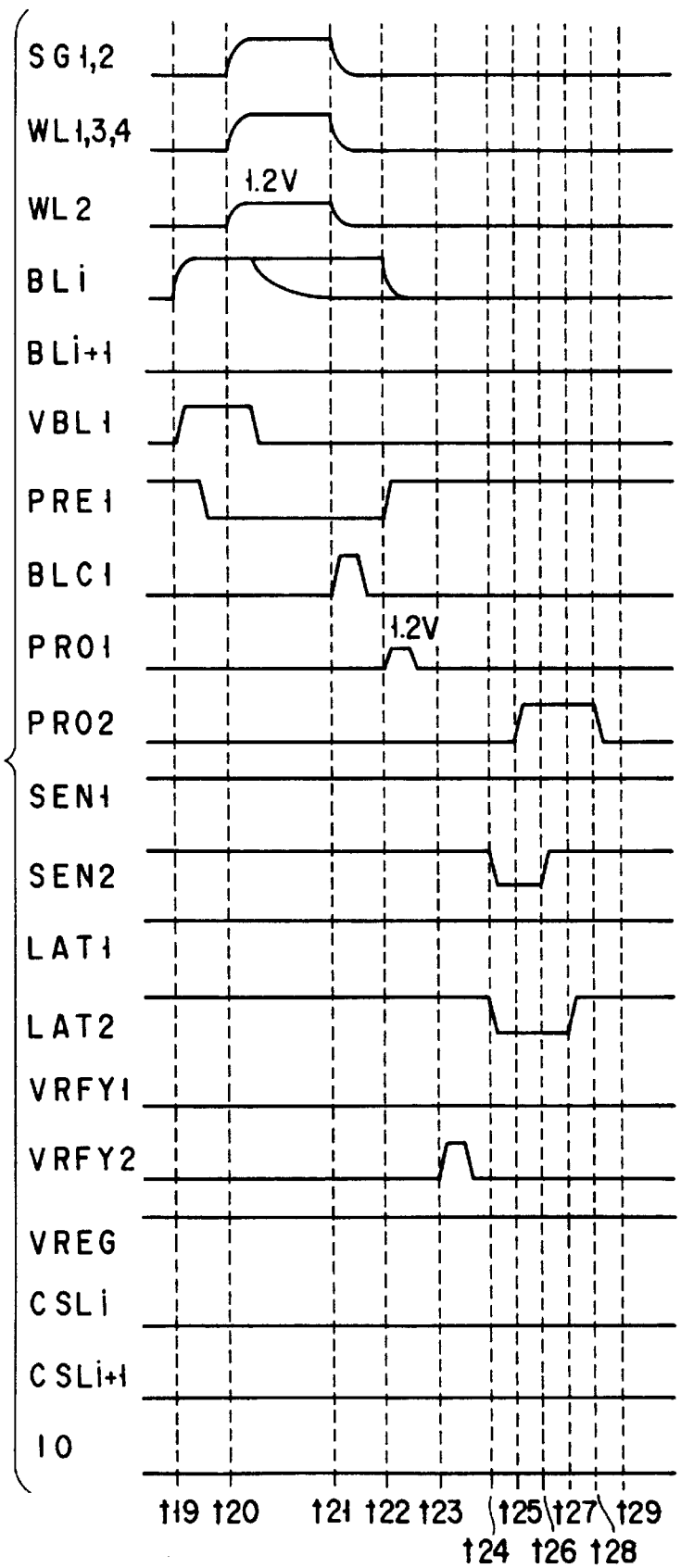
FIG. 20 is a timing chart for explaining how a second method of performing write verification is effected in one mode in the memory device according to the second embodiment.
Figure 21:
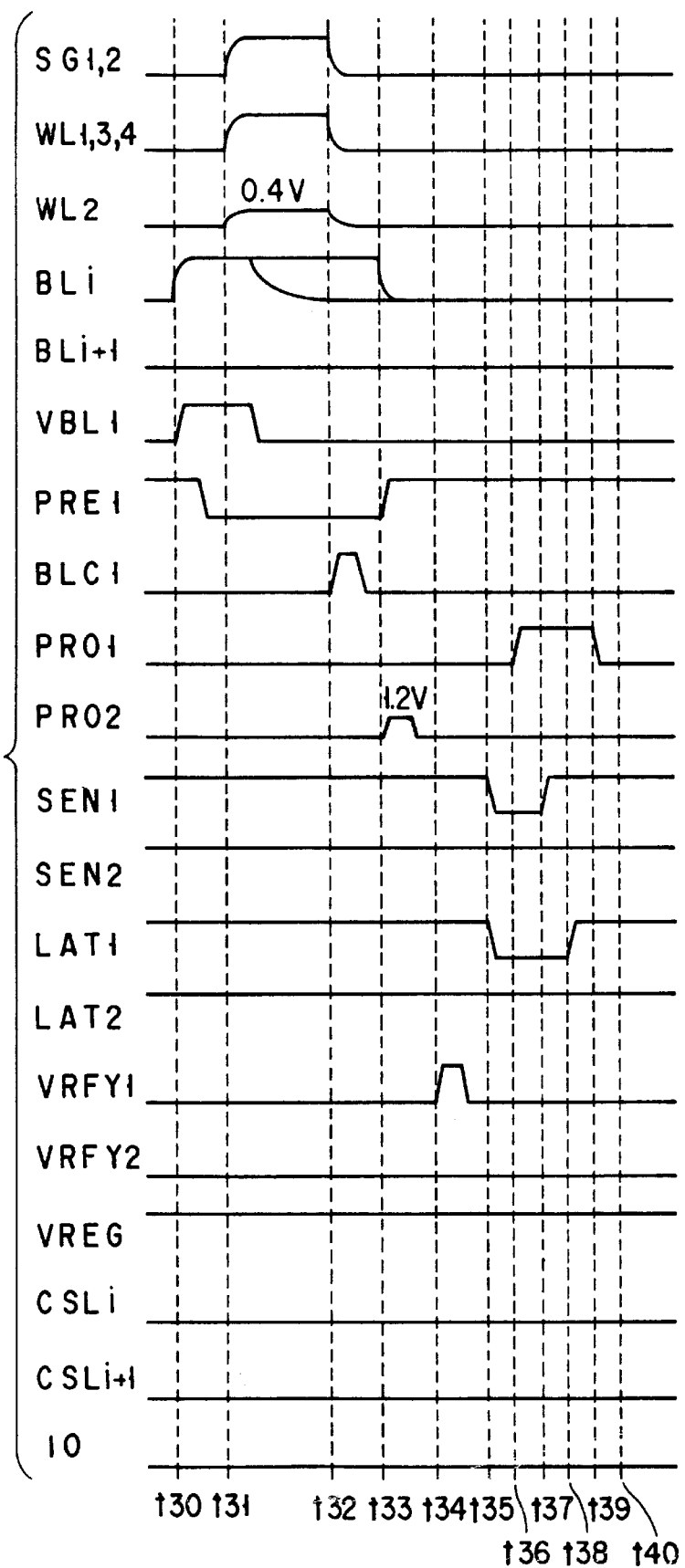
FIG. 21 is a timing chart for explaining how a third method of performing write verification is effected in one mode in the memory device according to the second embodiment.

After the data-writing operation performed at time t1 to time t6 (FIG. 18), write verification is effected to detect whether or not the data has been written into the memory cell. How the write verification is carried out will be explained, with reference to the timing charts of FIGS. 19, 20 and 21. Here, assume that one of the bit lines BL1 to BL4222, i.e., bit line BLi, is selected, that the word line WL2 is selected, that the signal CMOD is set at "H" level to store four-value data. If three data-storing levels are provided, three-value data can be stored in the memory cells of the EEPROM. The voltage VLB2 is 0V, the signal BLC2 is at "L" level, and the signal PRE2 remains at "H" level. Therefore, they are not shown in FIG. 19, 20 or 21.

First, at time t1, the voltage VBL1 is set at VCC, whereby the bit line BLi is charged to "H" level. At time t2, the signal PRE1 is set at "L" level, disconnecting the bit line BLi from the voltage source VBL1. Further, the select gate SG1 and the word lines WL1, WL3 and WL4 not selected are set at VCC, and the selected word line WL2 is set at 2.0V.

When the word line WL2 is set at 2.0V, the bit line BLi remains at "H" level if the memory cell M connected to the circuit 9 storing control data "3" has assumed the state of storing data "3". If this memory cell M has not assumed the state of storing data "3", the bit line BLi is set at "L" level. Since the memory cell M connected to the circuit 9 storing control data "2" or "1" has not taken the state of storing data "3", the bit line BLi is set at "L" level. At time t3, the signal BLC1 is set at "H" level, thereby applying the voltage on the bit line BLi to the node N(i,i+1) through the data transfer line 24.

After the signal BLC1 falls to "L" level, the signal VRFY1 rises to "H" level at time t5. The node N(i,i+1) is thereby set at "H" level only if the first sub-data is "0". At this time, the voltage VREG is equal to VCC. At time t6, the signals SEN1 and LAT1 are set at "L" level, deactivating the clocked inverters CI1 and CI2. At time t7, the signal PRO1 rises to "H" level. At time t8, the signal SEN1 rises to "H" level. The inverter IC1 is thereby activated and detects the voltage at the node N(i,i+1). When the signal LAT1 rises to "H" level at time t9, the clocked inverter CI2 is activated, whereby the logic level of the signal at the node N(i,i+1) is latched.

After the signal PRO1 falls to "L" level at time t10, the signal BLC1 is set at "H" level at time 11, applying the voltage on the bit line BLi to the node N(i,i+1). At time t12, the signal VRFY2 rises to "H" level. The node N(i,i+1) is set at "H" level only if the second sub-data is "0". At this time, the voltage VREG is VCC and the signal REG1 is at "H" level. Hence, the bit line BLi is reset to 0V at time t13. At time t14, the signals SEN2 and LAT2 fall to "H" level, deactivating the clocked inverters CI3 and CI4. The signal PRO2 rises to "H" level at time 15, and so does the signal SEN2 at time t16. The clocked inverter CI3 is thereby activated, detecting the voltage at the node N(i,i+1). When the signal LAT2 rises to "H" level at time t17, the clocked inverter CI4 is activated. The logic level of the signal at the node N(i,i+1) is thereby latched.

At time t18, the signal PRO2 falls to "L" level, and it is determined whether the memory cell M connected to the circuit 9 storing the control data "3" assumes the state of storing data "3" or not. If the memory cell M is found to assume the state of storing data "3", the control data "3" stored in the circuit 9 is changed to control data "0". In any other case, the control data remains unchanged.

Then it is determined whether the memory cell M connected to the circuit 9 storing the control data "2" assumes the state of storing data "2" or not. More precisely, the voltage VBL1 is set at VCC at time t19, charging the bit line BLi to "H" level. The signal PRE1 falls to "L" level, disconnecting the bit line BLi from the voltage source VBL1. At time t20, the select gate SG1 and the word lines WL1, WL3 and WL4 not selected are set at VCC, and the selected word line WL2 is set at 1.2V.

When the word line WL2 is set at 1.2V, the bit line BLi remains at "H" level if the memory cell M connected to the data-storing circuit which stores control data item "2" has assumed the state of storing data "2". If this memory cell M has not assumed the state of storing data "2", the bit line BLi is set at "L" level. Since the memory cell M connected to the circuit 9 storing the control data "1" has not assumed the state of storing data "2", the bit line BLi is set at "L" level. At time t21, the signal BLC1 is set at "H" level, thereby applying the voltage on the bit line BLi to the node N(i,1+1) through the data transfer line 24. When the signal BLC1 falls to "L" level, the signal PRE1 rises to "H" level at time t22. The bit line BLi is thereby reset at 0V, i.e., the voltage VBL1. At the same time, the signal PRO1 is set at 1.2V. If the first sub-data is "1", the node N(i,i+1) is set at "L" level. If the first sub-data is "0" and the node N(i,i+1) is at "H" level, the node N(i,i+1) remains at "L" level. If the first sub-data is "0" and the node N(i,i+1) is at "L" level, the signal PRO1 of 1.2V sets the node N(i,i+1) at 0.2V at most if the n-channel MOS transistor Qn32 has a threshold voltage of 1V. The clocked inverter CI3 may be designed to detect that voltage of the node N(i,i+1) is at "L" level when the voltage is 0.2V. Then, the node N(i,i+1) remains at "L" level.

At time t23, the signal VRFH2 rises to "H" level, and the node N(i,i+1) is set at "H" level only if the second sub-data is "0". At time t24, the signals SEN2 and LAT2 fall to "L" level, deactivating the clocked inverters CI3 and CI4. The signal PRO2 rises to "H" level at time t25, and so does the signal SEN2 at time t26. The inverter CI3 is thereby activated, detecting the voltage at the node N(i,i+1). At time t27, the signal LAT2 rises to "H" level, activating the inverter CI4. The logic level of the signal at the node N(i,i+1) is thereby latched.

At time t28, the signal PRO2 falls to "L" level. It is thus determined whether the memory cell M connected to the circuit 9 storing the control data "2" assumes the state of storing data "2". The control data item stored in the circuit 9 is changed to "0" only if the control data is "3" and the memory cell M connected to the circuit 9 stores a data item "3" or the control data is "2" and the memory cell M connected to the circuit 9 stores a data item "2". In any other case, the control data stored in the circuit 9 remains unchanged.

Then, it is determined whether the memory cell M connected to the circuit 9 storing the control data "2" assumes the state of storing data "2" or not. More precisely, the voltage VBL1 is set at VCC at time t19, charging the bit line BLi to "H" level. The signal PRE1 falls to "L" level, disconnecting the bit line BLi from the voltage source VBL1. At time t20, the select gates SG1 and SG2 and the word lines WL1, WL3 and WL4 not selected are set at VCC, and the selected word line WL2 is set at 1.2V.

Next, it is determined whether the memory cell M connected to the circuit 9 storing the control data "1" assumes the state of storing data "1" or not. To be more specific, the voltage VBL1 is set at VCC at time t30, charging the bit line BLi to "H" level. The signal PRE1 falls to "L" level, disconnecting the bit line BLi from the voltage source VBL1. At time t31, the select gates SG1 and SG2 and the word lines WL1, WL3 and WL4 not selected are set at VCC, and the selected word line WL2 is set at 0.4V.

When the word line WL2 is set at 0.4V, the bit line BLi remains at "H" level if the memory M cell connected to the circuit 9 storing control data item "1" has assumed the state of storing data item "1". The bit line BLi is set at "L" level if this memory cell has not taken yet the state of storing data item "1". At time t32, the signal BLC1 is set at "H" level, thereby applying the voltage on the bit line BLi to the node N(i,i+1) through the data transfer line 24. When the signal BLC1 falls to "L" level, the signal PRE1 rises to "H" level at time t33. The bit line BLi is thereby reset at 0V, i.e., the voltage VBL1. At the same time, the signal PRO1 is set at 1.2V. If the second sub-data is "1", the node N(i,i+1) is set at "L" level. If the second sub-data is "0" and the node N(i,i+1) is at "H" level, the node N(i,i+1) remains at "H" level. If the first sub-data is "0" and the node N(i,i+1) is at "L" level, the signal PRO1 of 1.2V sets the node N(i,i+1) at 0.2V at most if the n-channel MOS transistor Qn38 has a threshold voltage of 1V. The clocked inverter CI1 may be designed to detect that voltage of the node N(i,i+1) is at "L" level when the voltage is 0.2V. Then, the node N(i,i+1) remains at "L" level.

At time t34, the signal VRFY1 rises to "H" level, and the node N(i,i+1) is set at "H" level only if the first sub-data is "0". At time t35, the signals SEN1 and LAT1 fall to "L" level, deactivating the clocked inverters CI1 and CI2. The signal PRO1 rises to "H" level at time t36, and so does the signal SEN1 at time t37. The inverter CI1 is thereby activated, detecting the voltage at the node N(i,i+1). At time t38, the signal LAT1 rises to "H" level, activating the inverter CI2. The logic level of the signal at the node N(i,i+1) is thereby latched. Thus it is determined whether the memory cell M connected to the circuit 9 storing the control data "1" assumes the state of storing data "1". The control data item stored in the circuit 9 is changed to "0" only if the control data is "3" and the memory cell M connected to the circuit 9 stores a data item "3", if the control data is "2" and the memory cell M connected to the circuit 9 store a data item "2", or if the control data is "2" and memory cell M connected to the circuit 9 stores a data item "1". In any other case, the control data stored in the circuit 9 remains unchanged.

When the write verification (WV) described above is carried out, the control data items stored in the data-storing circuit 9 is changed in accordance with the data-storing states of the memory cells, as is shown in the following Table 10:

TABLE 10

| Data-Storing State of Memory Cell | Control Data before WV | Control Data after WV |
| --- | --- | --- |
| 0, 1, 2 or 3 | 0 | 0 |
| Not yet for 1 | 1 | 1 |
| 1 | 1 | 0 |
| Not yet for 2 | 2 | 2 |
| 2 | 2 | 0 |
| Not yet for 3 | 3 | 3 |
| 3 | 3 | 0 |

In each data-storing circuit 9, the second sub-data circuit 23 detects the logic level of the signal at the node N(i,i+1) provided on the data transfer line 24, on the basis of the data-storing state of the selected memory M and the first sub-data stored in the first sub-data circuit 22. Furthermore, the first sub-data circuit 22 detects the logic level of the signal at the node N(i,i+1) provided on the data transfer line 24, on the basis of the data-storing state of the selected memory M and the second sub-data stored in the second sub-data circuit 23. The control data stored in the data-storing circuit 9 can therefore be easily changed. This helps to simplify the circuit structure of the EEPROM and lower the manufacturing cost of the EEPROM.

Data items are written into the memory cells M by repeating the data-writing operation (t1 to t6, FIG. 18) and the write verification (FIGS. 19, 20 and 21) until all control data items change to "0". The data-storing state of a memory cell M does not change if the cell M is connected to a circuit 9 which stores the initial control data item "0". The memory cell M assumes the value of storing data item "1" if it is connected to a circuit 9 storing the initial control data item "1". The memory cell M assumes the value of storing data item "2" if it is connected to a circuit 9 storing the initial control data item "2". Similarly, the memory cell M assumes the value of storing data item "3" if it is connected to a circuit 9 storing the initial control data item "3". Whether all control data items are "0" can be determined by detecting whether or not the signal line PT (FIG. 6) is set at the ground potential. This is because the line PT is not set at the ground potential when all control data items are "0". The voltage on any word line WL selected to write data may be gradually increased.

A nonvolatile semiconductor memory device (EEPROM) according the sixth aspect of the present invention, comprises a memory cell array 1 including a plurality of nonvolatile memory cells M, a plurality of data transfer lines N(i,i+1) connected to the memory cell array 1, for transferring read signals indicating the data-storing states of the memory cells M, and a plurality of data-storing circuits 9 for storing control data items determining write-control voltages to be applied to the memory cells M to write data items into the memory cells M. The memory device is characterized in some respects. First, each data-storing circuit 9 comprises a first sub-data circuit 22 (CI1, CI2, Qn32, Qn33, Qn34) and a second sub-data circuit 23 (CI3, CI4, Qn38, Qn39, Qn40). Second, the control data item stored in each data-storing circuit 9 is composed of a first sub-data item stored in the first sub-data circuit 22 and a second sub-data item stored in the second sub-data circuit 23. Third, each data-storing circuit 9 applies the write-control voltage to corresponding memory cell M, in accordance with the control data item. Fourth, the second sub-data circuit 23 detects a logic level of the read signal on the data transfer line N(i,i+1), the logic level being determined by the data-storing state of the corresponding memory cell M and the first sub-data item stored in the first sub-data circuit 22. Further, the second sub-data circuit 23 changes the second sub-data item to suppress the writing of the data item into the memory cell M when it is determined that the data item has been completely written in the memory cell M.

The following are preferred embodiments of the memory device according to the sixth aspect of the present invention.

(1) The second sub-data circuit 23 selectively detects, in accordance with the second sub-data item, the logic level of the read signal on the data transfer line N(i,i+1) which is determined by the data-storing state of the corresponding memory cell M and the first sub-data item stored in the first sub-data circuit 22.

(2) The first sub-data circuit 22 detects the logic level of the read signal on the data transfer line N(i,i+1), which is determined by the data-storing state of the corresponding memory cell M and the second sub-data item stored in the second sub-data circuit, and changes the first sub-data item to suppress the writing of the data item into the memory cell M when it is determined that the data item has been completely written in the memory cell M.

(3) The first sub-data circuit 22 selectively detects, in accordance with the first sub-data item, the logic level of the read signal on the data transfer line N(i,i+1) which is determined by the data-storing state of the corresponding memory cell M and the second sub-data item stored in the second sub-data circuit 23.

(4) The first sub-data circuit 22 selectively detects, in accordance with the first sub-data item, the logic level of the read signal on the data transfer line N(i,i+1), which is determined by the data-storing state of the corresponding memory cell M and the second sub-data item stored in the second sub-data circuit, and changes the first sub-data item to suppress the writing of the data item into the memory cell M when it is determined that the data item has been completely written in the memory cell M.

(5) Each of the memory cells M can store a four-value data item, and the first sub-data circuit 22 and the second sub-data circuit 23 each comprise one flip-flop circuit composed of two inverters (CI1 and CI2; CI3 and CI4).

(6) Each of the memory cells M can store a three-value data item, and the first sub-data circuit 22 and the second sub-data circuit 23 each comprise one flip-flop circuit composed of two inverters (CI1 and CI2; CI3 and CI4).

A nonvolatile semiconductor memory device (EEPROM) according a seventh aspect of the present invention, comprises a memory cell array 1 including a plurality of nonvolatile memory cells M, a plurality of data transfer lines N(i,i+1) connected to the memory cell array 1, for transferring read signals representing the data items stored in the memory cells M, and a plurality of data-storing circuits 9 for storing data items to be read, which represent the data item stored in the memory cells M. The memory device is characterized in some respects. First, each data-storing circuit 9 comprises a first sub-data circuit 22 (CI1, CI2, Qn32, Qn33, Qn34) and a second sub-data circuit 23 (CI3, CI4, Qn38, Qn39, Qn4O). Second, each data item to be read is composed of a first sub-data item stored in the first sub-data circuit 22 and a second sub-data item stored in the second sub-data circuit 23. Third, the first sub-data circuit 22 detects and stores the logic level of the read signal on the data transfer line N(i,i+1), said logic level being determined by the data item stored in the corresponding memory cell M and the second sub-data item stored in the second sub-data circuit 23.

The following are preferred embodiments of the memory device according to the seventh aspect of the present invention.

(1) The first sub-data circuit 22 selectively detects, in accordance with the first sub-data item, the logic level of the read signal on the data transfer line N(i,i+1), which is determined by the data item stored in the corresponding memory cell M and the second sub-data item stored in the second sub-data circuit 23.

(2) Each of the memory cells M can store a four-value data item, and the first sub-data circuit 22 and the second sub-data circuit 23 each comprise one flip-flop circuit composed of two inverters (CI1 and CI2; CI3 and CI4).

(3) Each of the memory cells M can store a three-value data item, and the first sub-data circuit 22 and the second sub-data circuit 23 each comprise one flip-flop circuit composed of two inverters (CI1 and CI2; CI3 and CI4).

As described above, the EEPROM which is the second embodiment of the invention can store n-value data where $n \geq 3$. In each data-storing circuit 9, the second sub-data circuit 23 detects the logic level of the read signal on the data transfer line N(i,i+1), the logic level being determined by the data-storing state of any selected memory cell M and the first sub-data item stored in the first sub-data circuit 22. In some case, the first sub-data circuit 22 detects the logic level of the read signal on the data transfer line N(i,i+1), the logic level being determined by the data-storing state of the selected memory cell M and the second sub-data item stored in the second sub-data circuit 23. The control data stored in the data-storing circuit 9 can therefore be easily changed. This helps to simplify the circuit structure of the EEPROM. Furthermore, the first sub-data circuit 22 detects the logic level of the read signal on the data transfer line N(i,i+1), the logic level being determined by the data item stored in the selected memory cell M and the second sub-data item stored in the second sub-data circuit 23. Therefore, the data item can therefore be easily read from the memory cell M, and the EEPROM can be simple in structure and can be manufactured at low cost.

The present invention is not limited to the first and second embodiments described above. Rather, the invention can be applied to a multi-value storing, nonvolatile semiconductor memory device which has a NOR-type memory cell array. It can also be applied to a multi-value storing, nonvolatile semiconductor memory device in which hot electrons are injected into the memory cells to write data items thereto.

Various changes and modifications can be made, without departing from the scope and spirit of the present invention.

The EEPROM according to the first embodiment of the invention, which can store n-value data where $n \geq 3$, is advantageous in some respects. In this EEPROM, a read signal is supplied to selected memory cells in accordance with the control data item stored in each data-storing circuit. The control data item stored in one data-storing circuit can therefore be changed easily, and the structure of the EEPROM can be more simple than otherwise. In addition, data can be easily read from the selected memory cells since a read signal is supplied to selected memory cells. This also helps to simplify the structure of the EEPROM, making it possible to provide an inexpensive EEPROM.

Each data-storing circuit for storing control data items may be used to write four-value data items into the memory cells. The data-storing circuit may be divided into two units. Then, each unit can store control data items used to write two-value data items into the memory cell. If so, the data-storing circuits incorporated in the EEPROM do not become redundant. Thus, the EEPROM is less expensive than otherwise.

Furthermore, each data-storing circuit may be used to write three-value data items into the memory cells. The data-storing circuit may be divided into two units. In this case, too, each unit can store control data items used to write two-value data items into the memory cell, and the data-storing circuits incorporated in the EEPROM do not become redundant. Therefore, the EEPROM is less expensive than otherwise.

The EEPROM according to the second embodiment of the invention is advantageous in some respects. In each of the data-storing circuit, the second sub-data circuit detects the logic level of a signal on the data transfer line, from the data-storing state of any selected memory cell and the first sub-data stored in the first sub-data circuit. In some cases, the first sub-data circuit detects the logic level of a signal on the data transfer line, from the data-storing state of the selected memory cell and the second sub-data stored in the second sub-data circuit. The control data stored in the data-storing circuit can therefore be easily changed. This helps to simplify the circuit structure of the memory device. Further, the first sub-data circuit detects the logic level of a signal to be read, which is the data transfer line, from the data item stored in the selected memory cell and the second sub-data stored in the second sub-data circuit. Hence, the data item can therefore be easily read from the memory cell, and the memory device can be simple in structure. Hence, an inexpensive EEPROM can be provided.

As has been described, the present invention can provide a multi-value storing EEPROM which requires no complicated circuits for controlling components other than the memory cells. Moreover, it can provide a multi-value storing EEPROM in which no data-storing circuits become redundant when the multi-data EEPROM is used as a two-value EEPROM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A nonvolatile semiconductor memory device comprising:
   a memory cell array including a plurality of nonvolatile memory cells, each memory cell for storing an n-value data item, where $n \geq 3$;
   a plurality of bit lines;
   a plurality of word lines; and
   a plurality of data-storing circuits, each connected to said memory cell array by a bit line, for storing a control data item which determines a write-control voltage to be applied to the bit line,
   wherein each of said data-storing circuits comprises:
      a circuit for supplying a write-control voltage and a read bit-line signal to the bit line in accordance with the control data item,
      a circuit for detecting a signal level of the read bit-line signal converted in response to the data-storing states of the memory cell,
      a circuit for changing the control data item on the basis of the data-storing state of the memory cell, and
      a first sub-data circuit and a second sub-data circuit, each sub-data circuit for storing sub-data item of a first signal level or a second signal level, wherein each of the first and second sub-data circuits comprises:
         a circuit for changing stored sub-data item of the first signal level to sub-data item of the second signal level in response to a prescribed signal level of the read bit-line signal, and
         a circuit for holding the sub-data item of the second signal level.

2. A memory device according to claim 1, wherein each of the memory cells can store a four-value data item, and each of the data-storing circuits includes two sub-data circuits.

3. A memory device according to claim 1, wherein each of the memory cells can store a three-value data item, and each of the data-storing circuits includes two sub-data circuits.

4. A nonvolatile semiconductor memory device comprising:
   a memory cell array including a plurality of nonvolatile memory cells, each memory cell assuming a data-writing state corresponding to one of n data-storing levels where $n \geq 3$;
   a plurality of bit lines;
   a plurality of word lines; and
   a plurality of data-storing circuits, each connected to said memory cell array by a bit line, for storing one of n control data items of n logic levels where $n \geq 3$, each of said control data items determining a write-control voltage to be applied to the bit line, each of said data-storing circuits comprising:
      a circuit for supplying the write-control voltage to the bit line in accordance with a control data item;
      a circuit for supplying a read bit-line signal to the bit line when the control data item is at an i-th logic level where $2 \leq i \leq n$, thereby to detect whether the data-writing state of the memory cell connected to the data-storing circuit which stores a control data item at the i-th logic level is identified by the i-th data-storing level which corresponds to the i-th logic level;
      a circuit for detecting a signal level of the read bit-line signal converted in response to the data-storing state of the memory cell; and
      a circuit for changing the control data item on the basis of the data-storing state of the memory cell.

5. A memory device according to claim 4, wherein each of the data-storing circuits comprises a first sub-data circuit and a second sub-data circuit, each for storing sub-data item of a first signal level or a second signal level, each of the first and second sub-data circuits comprising:
   a circuit for changing stored sub-data item of the first signal level to sub-data item of the second signal level in response to a prescribed signal level of the read bit-line signal; and
   a circuit for holding the sub-data item of the second signal level.

6. A memory device according to claim 5, wherein each of the memory cells can store a four-value data item, and each of the data-storing circuits includes two sub-data circuits.

7. A memory device according to claim 5, wherein each of the memory cells can store a three-value data item, and each of the data-storing circuits includes two sub-data circuits.

8. A nonvolatile semiconductor memory device comprising:
   a memory cell array including a plurality of nonvolatile memory cells;
   a plurality of bit lines;
   a plurality of word lines;
   a switching device for assuming a first state to set a four data-writing state for each memory cell and a second state to set a two data-writing state for each memory cell; and
   a plurality of sub-data circuits, each sub-data circuit for storing a sub-data item;
   wherein, while the switching device remains in the first state, each pair of the sub-data circuits operates as a single data-storing circuit electrically connected to a bit line for storing a control data item, the control data item being defined by two sub-data items and determining a write-control voltage which is to be applied to the bit line in order to set one of the four data-writing states into memory cells connected to the bit line;
   and further wherein, while the switching device remains in the second state, each of sub-data circuits operates as an independent data-storing circuit electrically connected to a bit line for storing a control data item, the control data being defined by one sub-data item and determining a write-control voltage which is to be applied to the bit line in order to set one of two data-writing states into memory cells connected to the bit line.

9. A memory device according to claim 8, wherein each of sub-data circuits stores the sub-data item of a first signal level or a second signal level and changes stored sub-data item of the first signal level to sub-data item of the second signal level in response to a prescribed level of a bit-line signal.

10. A nonvolatile semiconductor memory device comprising:
   a memory cell array including a plurality of nonvolatile memory cells;
   a plurality of bit lines;
   a plurality of word lines;
   a switching device capable of assuming a first state to set a three data-writing state for each memory cell and a second state to set a two data-writing state for each memory cell; and
   a plurality of data storing circuits, each storing a sub-data item;
   wherein, while the switching device remains in the first state, each pair of the sub-data circuits operates as a single data-storing circuit electrically connected to a bit line for storing a control data item, the control data item being defined by two sub-data items and determining a write-control voltage which is to be applied to the bit line in order to set one of three data writing states into the memory cells connected to the bit line;
   and further wherein, while the switching device remains in the second state, each of sub-data circuits operates as an independent data-storing circuit electrically connected to a bit line for storing a control data item, the control data item being defined by one sub-data item and determining a write-control voltage which is to be applied to the bit line in order to set one of two data writing states into the memory cells connected to the bit line.

11. A memory device according to claim 10, wherein each sub-data circuit stores the sub-data item of a first signal level or a second signal level and changes stored sub-data item of the first signal level to sub-data item of the second signal level in response to a prescribed level of a bit-line signal.

12. A nonvolatile semiconductor memory device comprising:
   a memory cell array including a plurality of nonvolatile memory cells, each capable of storing an n-value data item where $n \geq 3$;
   a plurality of bit lines;
   a plurality of word lines; and
   a plurality of data-storing circuits, each connected to a bit line,
   wherein each data-storing circuit comprises:
      a circuit for storing a data item,
      a circuit for supplying a read bit-line signal to the bit line in accordance with the data item,
      a circuit for detecting a signal level of the read bit-line signal converted in response to the data item stored in the memory cells connected to the bit line,
      a circuit for storing the signal level of the read bit-line signal thus detected, and
      a first sub-data circuit and a second sub-data circuit, each sub-data circuit for storing sub-data item of a first signal level or a second signal level, wherein each of the first and second sub-data circuits comprises:
         a circuit for changing stored sub-data item of the first signal level to sub-data item of the second signal level in response to a prescribed signal level of the read bit-line signal, and
         a circuit for holding sub-data item of the second signal level.

13. A memory device according to claim 12, wherein each of the memory cells can store a four-value data item, and each of the data-storing circuits includes two sub-data circuits.

14. A memory device according to claim 12, wherein each of the memory cells can store a three-value data item, and each of the data-storing circuits includes two sub-data circuits.

15. A nonvolatile semiconductor memory device comprising:
   a memory cell array including a plurality of nonvolatile memory cells;
   a plurality of data transfer lines connected to the memory cell array, for transferring read signals indicating the data-storing states of the memory cells; and
   a plurality of data-storing circuits for storing control data items determining write-control voltages to be applied to the memory cells for writing data items into the memory cells, each data-storing circuit comprising a first sub-data circuit and a second sub-data circuit;
   wherein the control data item stored in each data-storing circuit is composed of a first sub-data item stored in the first sub-data circuit and a second sub-data item stored in the second sub-data circuit;
   each data-storing circuit further comprising a circuit for applying the write-control voltage to corresponding memory cell, in accordance with the control data item;
   and the second sub-data circuit comprising:
      a circuit for detecting a logic level of the read signal on the data transfer line, the logic level being determined by the data-storing state of the corresponding memory cell and the first sub-data item stored in the first sub-data circuit; and
      a circuit for changing the second sub-data item to suppress the writing of the data item into the memory cell when it is determined that the data item has been completely written in the memory cell.

16. A memory device according to claim 15, wherein said second sub-data circuit further comprises a circuit for selectively detecting, in accordance with the second sub-data item, the logic level of the read signal on the data transfer line which is determined by the data-storing state of the corresponding memory cell and the first sub-data stored in the first sub-data circuit.

17. A memory device according to claim 15, wherein said first sub-data circuit further comprises:
   a circuit for detecting, the logic level of the read signal on the data transfer line, which is determined by the data-storing state of the corresponding memory cell and the second sub-data stored in the second sub-data item circuit; and
   a circuit for changing the first sub-data item to suppress the writing of the data item into the memory cell when it is determined that the data item has been completely written in the memory cell.

18. A memory device according to claim 17, wherein said first sub-data circuit comprises a circuit for selectively detecting, in accordance with the first sub-data item the logic level of the read signal on the data transfer line, which is determined by the data-storing state of the corresponding memory cell and the second sub-data item stored in the second sub-data circuit.

19. A memory device according to claim 16, wherein said first sub-data circuit further comprises: a circuit for selectively detecting, in accordance with the first sub-data item, the logic level of the read signal on the data transfer line which is determined by the data-storing state of the corresponding memory cell and the second sub-data item stored in the second sub-data circuit; and a circuit for changing the first sub-data item to suppress the writing of the data item into the memory cell when it is determined that the data item has been completely written in the memory cell.

20. A memory device according to claim 15, wherein each of said memory cells can store a four-value data item, and each of said first and second sub-data circuits includes one flip-flop circuit.

21. A memory device according to claim 15, wherein each of said memory cells can store a three-value data item, and each of said first and second sub-data circuits includes one flip-flop circuit.

22. A nonvolatile semiconductor memory device comprising:

a memory cell array including a plurality of nonvolatile memory cells;

a plurality of data transfer lines connected to the memory cell array, for transferring read signals representing the data items stored in the memory cells; and a plurality of data-storing circuits for storing data item to be read which represent the data item stored in the memory cell, wherein each of said data-storing circuits comprises a first sub-data circuit and a second sub-data circuit and each data item to be read is composed of a first sub-data item stored in the first sub-data circuit and a second sub-data item stored in the second sub-data circuit;

and further wherein the first sub-data circuit comprises a circuit for detecting and storing the logic level of the read signal on the data transfer line, said logic level being determined by the data item stored in the corresponding memory cell and the second sub-data item stored in the second sub-data circuit.

23. A memory device according to claim 22, wherein said first sub-data circuit further comprises a circuit for selectively detecting, in accordance with the first sub-data item, the logic level of the read signal on the data transfer line, which is determined by the data item stored in the corresponding memory cell and the second sub-data stored in the second sub-data circuit.

24. A memory device according to claim 22, wherein each of said memory cells can store a four-value data item, and each of said first and second sub-data circuits includes one flip-flop circuit.

25. A memory device according to claim 22, wherein each of said memory cells can store a three-value data item, and each of said first and second sub-data circuits includes one flip-flop circuit.

26. A nonvolatile semiconductor memory device comprising:

a memory cell array including a plurality of nonvolatile memory cells;

a plurality of data transfer lines connected to the memory cell array, for transferring read signals indicating the data-storing states of the memory cells; and a plurality of data-storing circuits for storing control data items determining write-control voltages to be applied to the memory cells for writing data items into the memory cells, each data-storing circuit comprising a first sub-data circuit and a second sub-data circuit;

wherein the control data item stored in each data-storing circuit is composed of a first sub-data item stored in the first sub-data circuit and a second sub-data item stored in the second sub-data circuit;

each data-storing circuit further comprising a circuit for applying a write-control voltage to a corresponding memory cell, in accordance with the control data item;

wherein the second sub-data circuit comprises:

a circuit for detecting a logic level of the read control signal on the data transfer line, the logic level being determined by the data storing state of the corresponding memory cell and the first sub-data item stored in the first sub-data circuit, a circuit for changing the second sub-data item to suppress the writing of the data item into the memory cell when it is determined that the data item is completely written in the memory cell, and a circuit for selectively detecting, in accordance with the second sub-data item, the logic level of the read-control signal on the data transfer line which is determined by the data-storing state of the corresponding memory cell and the first sub-data item stored in the first sub-data circuit; and wherein said first sub-data circuit further comprises:

a circuit for detecting, the logic level of the read-control signal on the data transfer line which is determined by the data-storing state of the corresponding memory cell and the second sub-data item stored in the second sub-data circuit, a circuit for changing the first sub-data item to suppress the writing of the data item into the memory cell when it is determined that the data item has been completely written in the memory cell, and a circuit for selectively detecting in accordance with the first sub-data item, the logic level of the read signal on the data transfer line, which is determined by the data-storing state of the corresponding memory cell and the second sub-data item stored in the second sub-data circuit.

27. A memory device according to claim 26, wherein each of said memory cells can store a four-value data item, and each of said first and second data-storing circuits includes one flip-flop circuit.

28. A memory device according to claim 26, wherein each of said memory cells can store a three-value data item, and each of said first and second data-storing circuits includes one flip-flop circuit.

* * * * *